(12) United States Patent
Harada et al.

(10) Patent No.: US 12,074,048 B2
(45) Date of Patent: Aug. 27, 2024

(54) SUBSTRATE PROCESSING APPARATUS AND SUBSTRATE PROCESSING METHOD

(71) Applicant: Tokyo Electron Limited, Tokyo (JP)

(72) Inventors: Hiroki Harada, Kumamoto (JP); Tatsuhiko Tsujihashi, Kumamoto (JP); Tokutarou Hayashi, Kumamoto (JP); Tsuyoshi Otsuka, Kumamoto (JP); Yuji Kawaguchi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 723 days.

(21) Appl. No.: 17/336,322

(22) Filed: Jun. 2, 2021

(65) Prior Publication Data

US 2021/0384058 A1 Dec. 9, 2021

(30) Foreign Application Priority Data

Jun. 3, 2020 (JP) ................................ 2020-096601

(51) Int. Cl.
| | |
|---|---|
| *H01L 21/68* | (2006.01) |
| *B25J 19/02* | (2006.01) |
| *B65G 47/90* | (2006.01) |
| *H01L 21/67* | (2006.01) |
| *H01L 21/687* | (2006.01) |

(52) U.S. Cl.
CPC .......... *H01L 21/681* (2013.01); *B25J 19/021* (2013.01); *B65G 47/90* (2013.01); *H01L 21/67259* (2013.01); *H01L 21/68707* (2013.01)

(58) Field of Classification Search
CPC ............. H01L 21/681; H01L 21/67259; H01L 21/68707; B25J 19/021; B65G 47/90
See application file for complete search history.

(56) References Cited

U.S. PATENT DOCUMENTS

| | | | | |
|---|---|---|---|---|
| 6,040,585 A | * | 3/2000 | Hsiao | ..................... H01L 21/681 414/217 |
| 6,546,307 B1 | * | 4/2003 | Hsiao | ................ H01L 21/67742 700/121 |
| 2011/0125325 A1 | * | 5/2011 | Fujii | ...................... B25J 9/1692 901/3 |

(Continued)

FOREIGN PATENT DOCUMENTS

| | | |
|---|---|---|
| JP | 2018-137383 A | 8/2018 |
| WO | 2010/013732 A1 | 2/2010 |

*Primary Examiner* — Kyle O Logan
(74) *Attorney, Agent, or Firm* — XSENSUS LLP

(57) ABSTRACT

A substrate processing apparatus according to an aspect of the present disclosure includes a substrate processing unit, a substrate transfer unit, a first detection unit, a second detection unit, and a third detection unit. The substrate processing unit holds and processes a substrate. The substrate transfer unit has a rotational axis and carries the substrate in the substrate processing unit. The first detection unit detects a position of the substrate transfer unit relative to the substrate processing unit in a direction of travel thereof when the substrate is carried in the substrate processing unit in the direction of travel. The second detection unit detects a position of the substrate transfer unit relative to the substrate processing unit in a direction that is perpendicular to the direction of travel. The third detection unit detects an inclination of the rotational axis of the substrate transfer unit relative to the substrate processing unit.

14 Claims, 15 Drawing Sheets

(56) References Cited

U.S. PATENT DOCUMENTS

| | | | |
|---|---|---|---|
| 2016/0091892 A1* | 3/2016 | Okita | B25J 9/1674 |
| | | | 700/121 |
| 2018/0240695 A1* | 8/2018 | Hayashi | G03F 7/70733 |
| 2021/0213614 A1* | 7/2021 | Okada | H01L 21/677 |

* cited by examiner

SUBSTRATE PROCESSING APPARATUS AND SUBSTRATE PROCESSING METHOD

CROSS-REFERENCE TO RELATED APPLICATIONS

The present application claims the benefit of priority to Japanese Patent Application No. 2020-096601 filed on Jun. 3, 2020, the entire contents of which Japanese Patent Application are incorporated by reference in the present application.

FIELD

A disclosed embodiment(s) relate(s) to a substrate processing apparatus and a substrate processing method.

BACKGROUND

A technique has conventionally been known that carries a substrate in a substrate processing unit that processes a substrate such as a semiconductor wafer (that will also be called a wafer below) and places it thereon (see Japanese Patent Application Publication No. 2018-137383).

SUMMARY

A substrate processing apparatus according to an aspect of the present disclosure includes a substrate processing unit, a substrate transfer unit, a first detection unit, a second detection unit, and a third detection unit. The substrate processing unit holds and processes a substrate. The substrate transfer unit has a rotational axis and carries the substrate in the substrate processing unit. The first detection unit detects a position of the substrate transfer unit relative to the substrate processing unit in a direction of travel thereof when the substrate is carried in the substrate processing unit in the direction of travel. The second detection unit detects a position of the substrate transfer unit relative to the substrate processing unit in a direction that is perpendicular to the direction of travel. The third detection unit detects an inclination of the rotational axis of the substrate transfer unit relative to the substrate processing unit.

DESCRIPTION OF EMBODIMENTS

Figure 1:
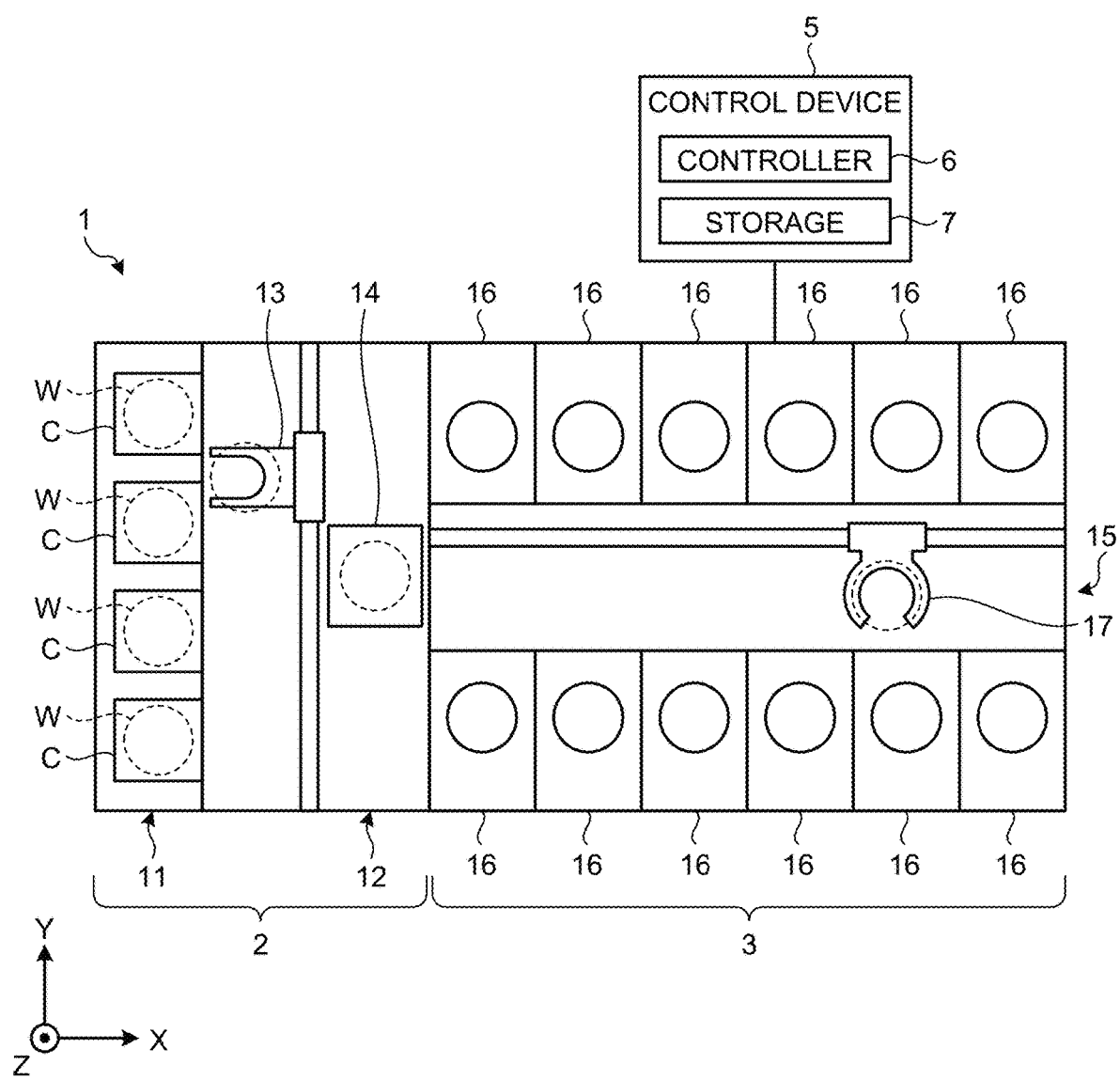
FIG. 1 is a schematic diagram that illustrates a schematic configuration of a substrate processing system according to an embodiment.

Hereinafter, an embodiment(s) of a substrate processing apparatus and a substrate processing method as disclosed in the present application will be explained in detail with reference to the accompanying drawing(s). Additionally, the present disclosure is not limited by each embodiment as illustrated below. Furthermore, it should be noted that the drawing(s) is/are schematic where a relationship(s) among dimensions of respective elements, a ratio(s) of respective elements, or the like may be different from a real one(s). Moreover, parts where a relationship(s) among mutual dimensions and/or ratios is/are different among mutual drawings may also be included.

An embodiment provides a technique that is capable of improving a degree of accuracy of centering at a time when a substrate is placed in a substrate processing unit.

A technique has conventionally been known that carries a substrate in a substrate processing unit that processes a substrate such as a semiconductor wafer (that will also be called a wafer below) and places it thereon. However, in a case where an orientation of a substrate transfer unit that carries a substrate therein is inclined, it is difficult to improve a degree of accuracy of centering of a substrate relative to a substrate processing unit.

Hence, a technique is expected that is capable of overcoming a problem(s) as described above and improving a degree of accuracy of centering at a time when a substrate is placed in a substrate processing unit.

Outline of Substrate Processing System

First, a schematic configuration of a substrate processing system 1 according to an embodiment will be explained with reference to FIG. 1. FIG. 1 is a schematic diagram that illustrates a schematic configuration of the substrate processing system 1 according to an embodiment.

Additionally, the substrate processing system 1 is an example of a substrate processing apparatus. Hereinafter, in order to clarify a positional relationship, an X-axis, a Y-axis, and a Z-axis that are orthogonal to one another are defined and a positive direction of the Z-axis is provided as a vertically upward direction.

As illustrated in FIG. 1, the substrate processing system 1 includes a carry-in/out station 2 and a processing station 3. The carry-in/out station 2 and the processing station 3 are provided adjacently.

The carry-in/out station 2 includes a carrier placing section 11 and a transfer section 12. On the carrier placing section 11, a plurality of carriers C are placed that house a plurality of substrates, in a first embodiment, semiconductor wafers W (that will be called wafers W below), in a horizontal state thereof.

The transfer section 12 is provided so as to be adjacent to the carrier placing section 11 and includes a substrate transfer device 13 and a delivery unit 14 in an inside thereof. The substrate transfer device 13 includes a wafer holding mechanism that holds a wafer W. Furthermore, the substrate transfer device 13 is capable of moving in a horizontal direction and a vertical direction and pivoting around a vertical axis as a center thereof, and executes transfer of a wafer W between a carrier C and the delivery unit 14 by using a wafer holding mechanism.

The processing station 3 is provided so as to be adjacent to the transfer section 12. The processing station 3 includes a transfer unit 15 and a plurality of cleaning units 16. The plurality of cleaning units 16 are provided side by side on both sides of the transfer unit 15.

The transfer unit 15 includes a substrate transfer device 17 in an inside thereof. The substrate transfer device 17 includes a wafer holding mechanism that holds a wafer W. Furthermore, the substrate transfer device 17 is capable of moving in a horizontal direction and a vertical direction and pivoting around a vertical axis as a center thereof, and executes transfer of a wafer W between the delivery unit 14 and a cleaning unit 16 by using a wafer holding mechanism. A detail(s) of such a substrate transfer device 17 will be described later.

A cleaning unit 16 executes a predetermined cleaning process for a peripheral part of a wafer W that is transferred by the substrate transfer device 17. A detail(s) of such a cleaning unit 16 will be described later.

Additionally, in the present disclosure, directions along an X-axis are provided as frontward and backward directions where a positive direction of the X-axis is provided as a frontward direction. Furthermore, in the present disclosure, direction where the carry-in/out station 2 and the processing station 3 are arranged side by side (directions along a Y-axis in the figure) are provided as leftward and rightward directions and a side of an end where the carry-in/out station 2 is provided is provided as a right side. Then, in the present disclosure, a positive direction of a Y-axis is provided as a rightward direction.

Furthermore, the substrate processing system 1 includes a control device 5. Such a control device 5 is, for example, a computer, and includes a controller 6 and a storage 7. The storage 7 stores therein a program that controls a variety of processes that are executed in the substrate processing system 1. The controller 6 reads and executes a program that is stored in the storage 7 so as to control an operation of the substrate processing system 1.

Additionally, such a program may be recorded in a computer-readable storage medium and be installed from such a storage medium to the storage 7 of the control device 5. For a computer-readable storage medium, for example, a hard disk (HD), a flexible disk (FD), a compact disk (CD), a magnetooptical disk (MO), a memory card, or the like is provided.

In the substrate processing system 1 that is configured as described above, first, the substrate transfer device 13 of the carry-in/out station 2 takes a wafer W from a carrier C that is placed on the carrier placing section 11 and places a taken wafer W on the delivery unit 14. A wafer W that is placed on the delivery unit 14 is taken from the delivery unit 14 by the substrate transfer device 17 of the processing station 3 and is carried in a cleaning unit 16.

A wafer W that is carried in a cleaning unit 16 is processed by the cleaning unit 16, subsequently is carried out of the cleaning unit 16 by the substrate transfer device 17, and is placed on the delivery unit 14. Then, a processed wafer W that is placed on the delivery unit 14 is returned to a carrier C of the carrier placing section 11 by the substrate transfer device 13.

Configuration of Cleaning Unit

Figure 2:
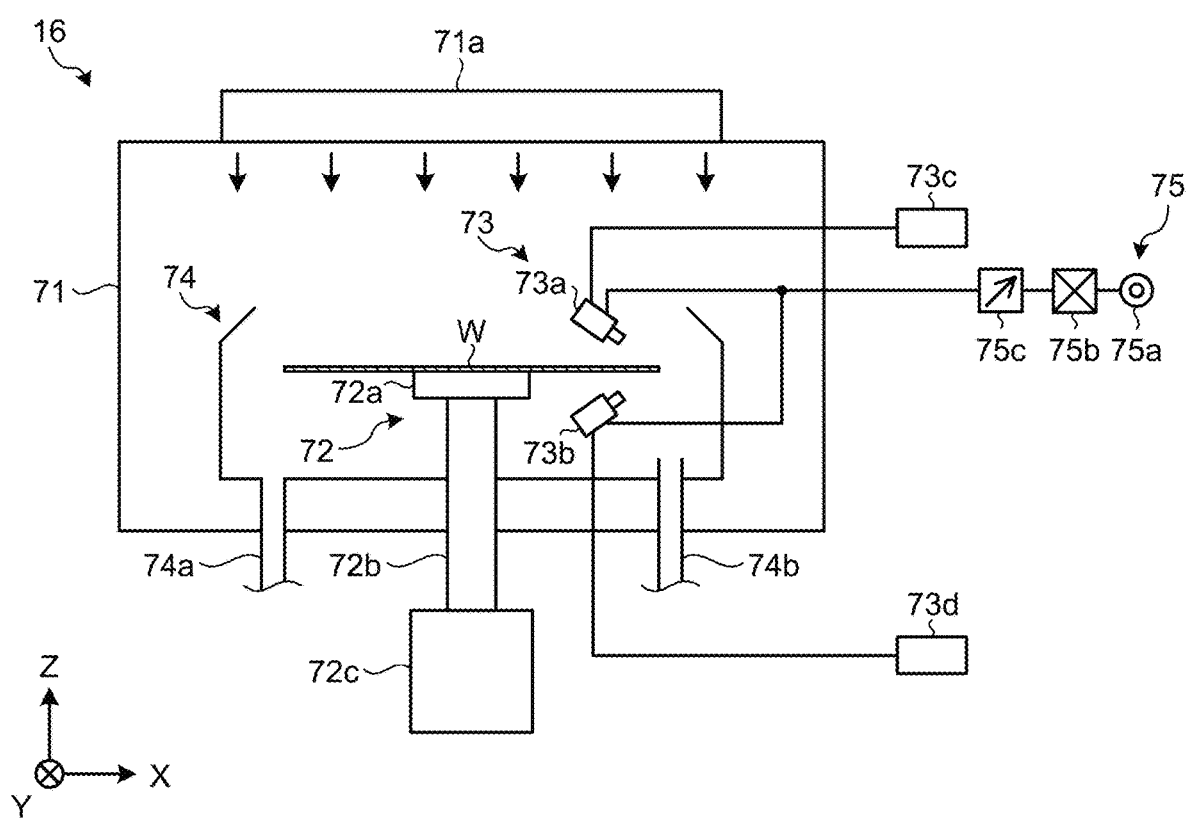
FIG. 2 is a schematic diagram that illustrates a specific configuration example of a cleaning unit according to an embodiment.

Next, a configuration of a cleaning unit 16 according to an embodiment will be explained with reference to FIG. 2. FIG. 2 is a schematic diagram that illustrates a specific configuration example of the cleaning unit 16 according to an embodiment. As illustrated in FIG. 2, the cleaning unit 16 includes a chamber 71, a substrate processing unit 72, a cleaning liquid discharge unit 73, and a recovery cup 74.

The chamber 71 houses the substrate processing unit 72, the cleaning liquid discharge unit 73, and the recovery cup 74. A Fun Filter unit (FFU) 71a that forms downflow in the chamber 71 is provided on a ceiling part of the chamber 71.

The substrate processing unit 72 holds a wafer W so as to be rotatable and applies liquid processing to a held wafer W. The substrate processing unit 72 has a holding unit 72a that holds a wafer W horizontally, a supporting member 72b that extends in a vertical direction and supports the holding unit 72a, and a driving unit 72c that rotates the supporting member 72b around a vertical axis.

The holding unit 72a is connected to a (non-illustrated) suction device such as a vacuum pump and adsorbs a back surface of a wafer W by utilizing a negative pressure that is generated by suction of such a suction device, so as to hold the wafer W horizontally. For the holding unit 72a, it is possible to use, for example, a porous chuck, an electrostatic chuck, and/or the like.

The holding unit 72a has an adsorption region with a diameter that is less than that of a wafer W. Thereby, it is possible to supply a cleaning liquid that is discharged from a lower side nozzle 73b of the cleaning liquid discharge unit 73 as described later to a side of a back surface of a peripheral part of a wafer W.

The cleaning liquid discharge unit 73 has an upper side nozzle 73a and a lower side nozzle 73b. The upper side nozzle 73a is arranged above a wafer W that is held by the substrate processing unit 72 and the lower side nozzle 73b is arranged below such a wafer W.

A cleaning liquid supply unit 75 is connected to the upper side nozzle 73a and the lower side nozzle 73b. The cleaning liquid supply unit 75 has a cleaning liquid supply source 75a, a valve 75b, and a flow volume regulator 75c in order from an upstream side thereof. The cleaning liquid supply source 75a is, for example, a tank that stores a cleaning liquid. The flow volume regulator 75c regulates a flow volume of a cleaning liquid that is supplied from the cleaning liquid supply source 75a to the upper side nozzle 73a and the lower side nozzle 73b through the valve 75b.

The upper side nozzle 73a discharges a cleaning liquid that is supplied from the cleaning liquid supply unit 75 to a side of a front surface of a peripheral part of a wafer W that is held by the substrate processing unit 72. The lower side nozzle 73b discharges a cleaning liquid that is supplied from the cleaning liquid supply unit 75 to a side of a back surface of a peripheral part of a wafer W that is held by the substrate processing unit 72.

Furthermore, the cleaning liquid discharge unit 73 has a first movement mechanism 73c that moves the upper side nozzle 73a and a second movement mechanism 73d that moves the lower side nozzle 73b. The upper side nozzle 73a and the lower side nozzle 73b are moved by using such a first movement mechanism 73c and a second movement mechanism 73d, so that it is possible to change a position of discharge of a cleaning liquid on a wafer W.

The recovery cup 74 is arranged so as to surround the substrate processing unit 72. A liquid discharge port 74a for discharging a cleaning liquid that is discharged from the cleaning liquid discharge unit 73 to an outside of the chamber 71 and a gas discharge port 74b for discharging an atmosphere in the chamber 71 are formed on a bottom part of the recovery cup 74.

The cleaning unit 16 is configured as described above, and adsorbs and holds a back surface of a wafer W by the holding unit 72a and subsequently rotates the wafer W by using the driving unit 72c.

Then, the cleaning unit 16 discharges a cleaning liquid from the upper side nozzle 73a toward a side of a front surface of a peripheral part of a rotating wafer W. Furthermore, in parallel to such a discharging process, the cleaning unit 16 discharges a cleaning liquid from the lower side nozzle 73b toward a side of a back surface of a peripheral part of a rotating wafer W. Thereby, it is possible to execute a cleaning process for a peripheral part of a wafer W.

Configuration of Substrate Transfer Device

Figure 3:
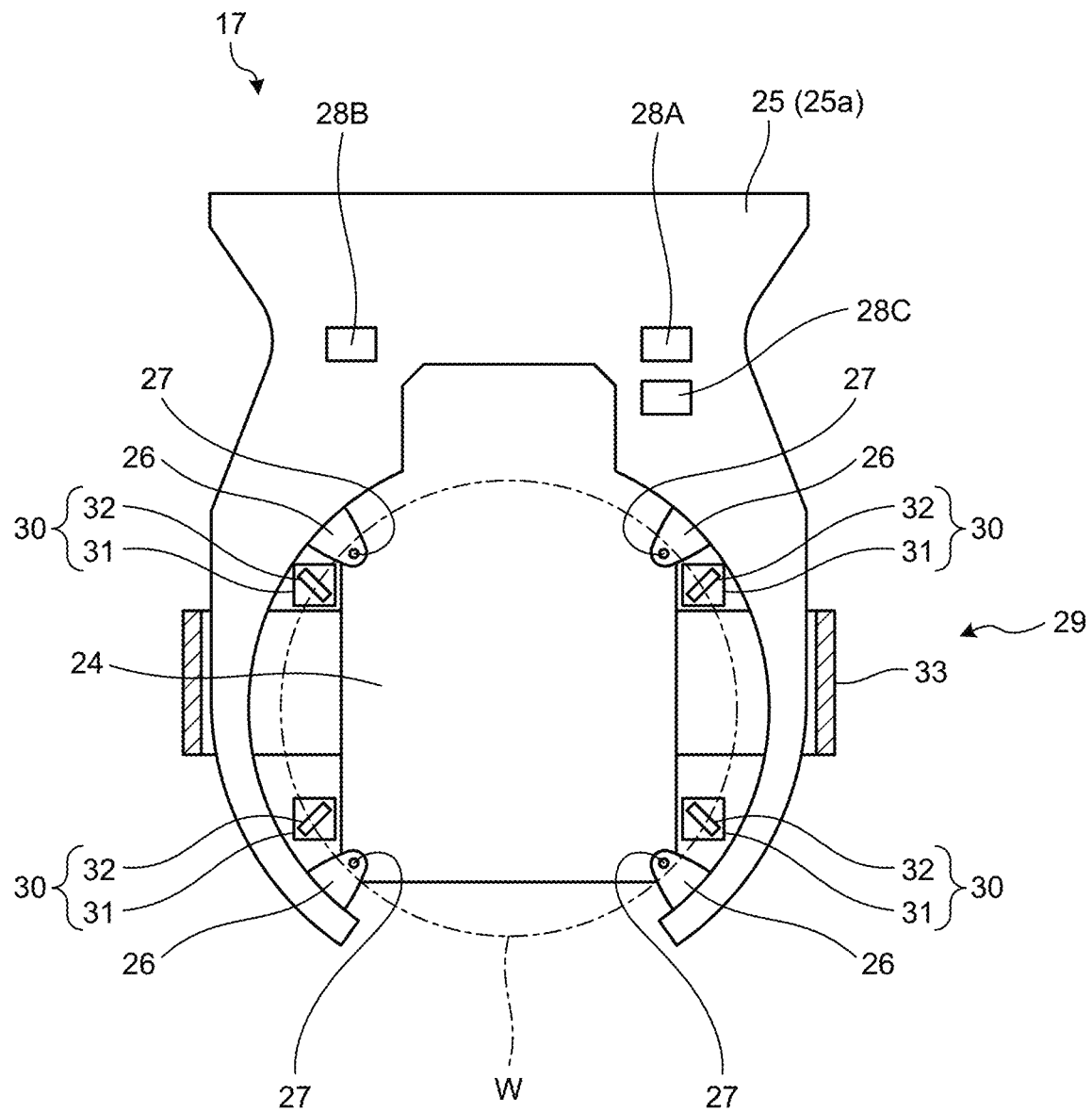
FIG. 3 is a plan view that illustrates a substrate transfer device according to an embodiment.

Next, a configuration of a substrate transfer device 17 according to an embodiment will be explained with reference to FIG. 3 to FIG. 11. FIG. 3 is a plan view of the substrate transfer device 17 according to an embodiment. The substrate transfer device 17 has two forks 25 that are arranged so as to overlap one above another (where one of them is not illustrated therein). A fork(s) 25 is/are an example(s) of a substrate transfer unit.

One of the two forks 25 is used in order to receive a wafer W from a module and another thereof is used in order to deliver a wafer W to a module.

A fork 25 has a body part 25a and a plurality of claw parts 26. The body part 25a is configured to be of a horseshoe shape in such a manner that a distal part is forked from a proximal part and extends in a direction of forward travel of the fork 25 so as to surround side peripheries of a wafer W. The plurality of (four in the figure) claw parts 26 protrude toward an inner side of the body part 25a with a horseshoe shape and supports a back surface of a wafer W.

Suction holes 27 that suction and hold a back surface of a wafer W are respectively formed on the plurality of claw parts 26. Additionally, when a base table 24 is lowered in order to deliver a wafer W to a module, such suction is stopped.

Furthermore, three through-holes 28A, 28B, 28C are provided on a side of a proximal end of the body part 25a of the fork 25. A through-holes 28A and a through-hole 28B are provided side by side along a direction that is perpendicular to a direction of forward travel of the fork 25. The through-hole 28A and a through-hole 28C are provided side by side along a direction of forward travel of the fork 25.

A wafer detection unit 29 has four light-emitting units 31, four light-receiving units 32, and a support unit 33. The four light-emitting units 31 are provided below the fork 25. The four light-receiving units 32 are provided above the fork 25 and above the four light-emitting units 31 respectively. The support unit 33 supports the four light-emitting units 31 and the four light-receiving units 32 relative to the base table 24.

One light-emitting unit 31 and one light-receiving unit 32 mutually provides a set thereof and are configured as one transmission-type optical sensor. Hereinafter, such a set of the light-emitting unit 31 and the light-receiving unit 32 will be provided as a sensor for wafer detection 30.

A light-emitting unit 31 and a light-receiving unit 32 that belong to an identical sensor for wafer detection 30 are provided so as to interpose a peripheral part of a wafer W that is held by the fork 25 that is positioned at a backward travel position thereof between upper and lower sides thereof and respective sets thereof are provided at an interval (s) in a circumferential direction of the wafer W.

Figure 4:
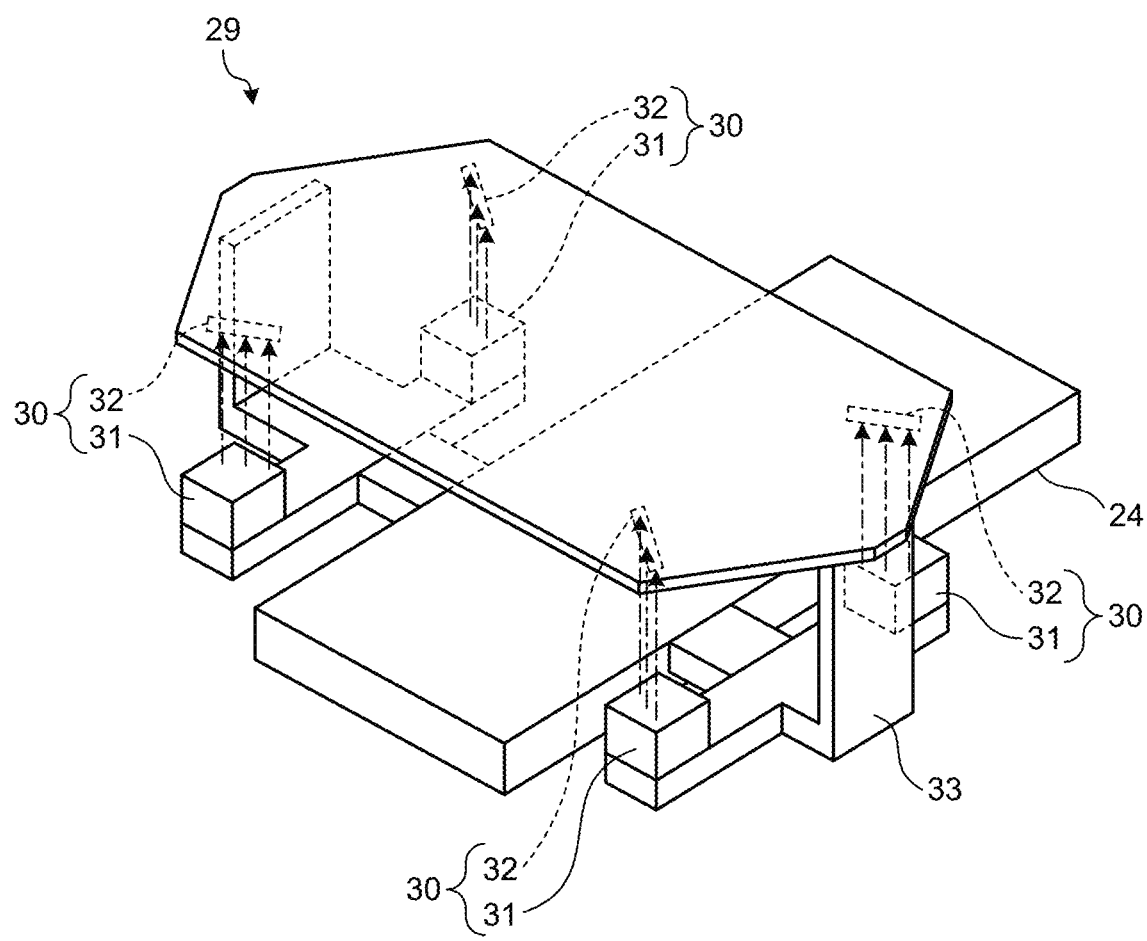
FIG. 4 is a perspective view that illustrates a wafer detecting unit according to an embodiment.

FIG. 4 is a perspective view of a wafer detection unit 29 according to an embodiment. As illustrated in FIG. 4, a light-emitting unit 31 is configured to emit light upward where an arrow in FIG. 4 indicates such a light path(s). A light-receiving unit 32 is composed of multiple light-receiving elements that are arranged linearly from a center side of a wafer W toward an outer peripheral side thereof.

A part of light that is emitted from the light-emitting unit 31 is blocked by a peripheral part of a wafer W that is held by the fork 25 at a backward travel position and another part thereof passes through a side of the wafer W and irradiates the light-receiving unit 32. Therefore, a size of a region that is irradiated with light on the light-receiving unit 32, that is, a number of a light-receiving element(s) that receive(s) light, is changed depending on a position of a peripheral end of a wafer W directly above the light-emitting unit 31.

The light-receiving unit 32 transmits a detection signal that is dependent on a size of a region that is irradiated with light to a controller 6 (see FIG. 1). The controller 6 detects respective positions of peripheral ends of a wafer W directly above respective light-receiving units 32 based on such a detection signal and calculates a central position of the wafer W that is held by the fork 25 from detected respective positions.

Figure 5:
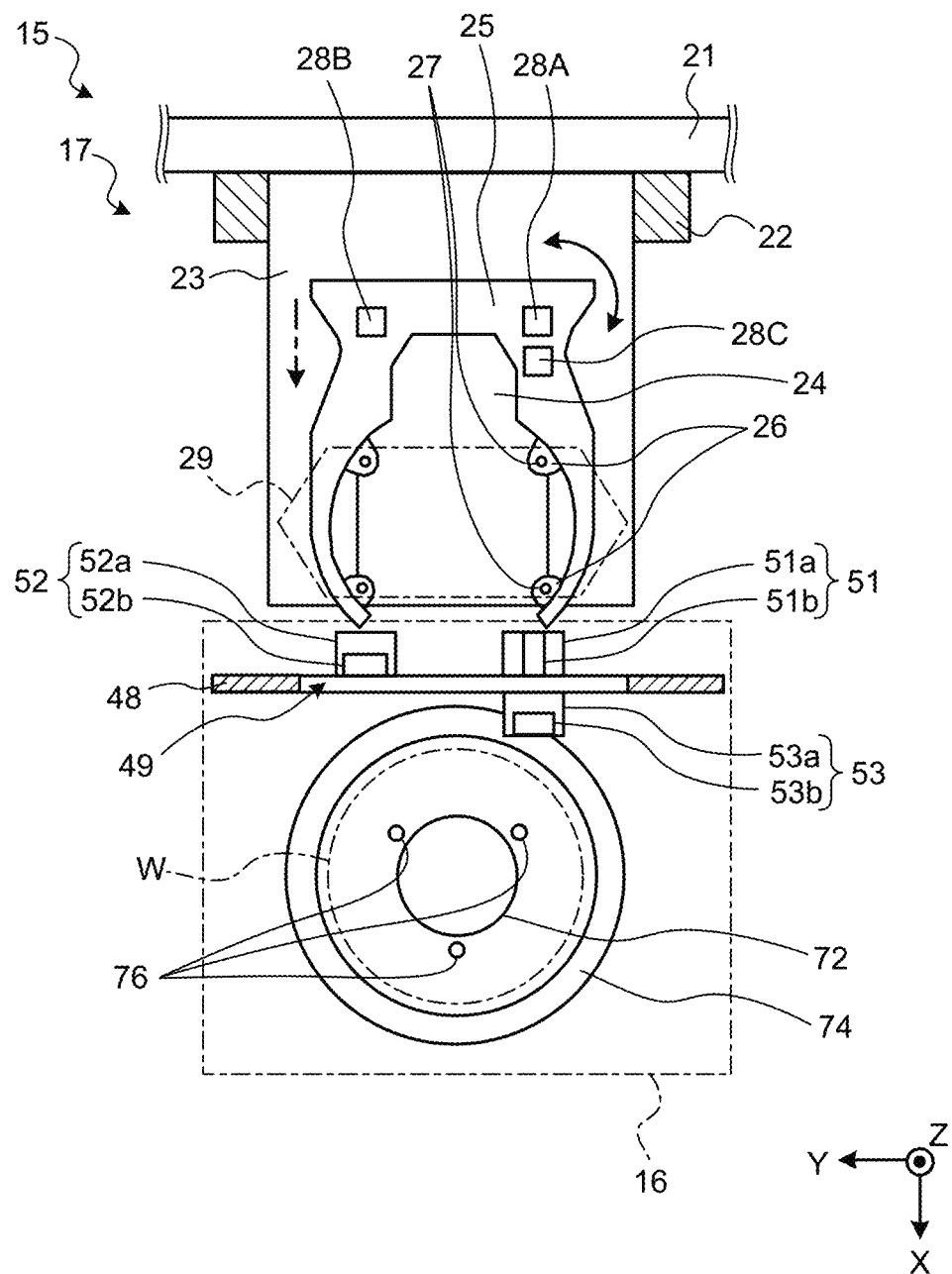
FIG. 5 is a plan view that illustrates a substrate transfer device and a cleaning unit according to an embodiment.

FIG. 5 is a plan view of a substrate transfer device 17 and a cleaning unit 16 according to an embodiment. As illustrated in FIG. 5, the substrate transfer device 17 has a left/right driving unit 21, a frame 22, a lifting/lowering table 23, a base table 24, two forks 25, and a wafer detection unit 29. The left/right driving unit 21 horizontally moves the frame 22 leftward or rightward.

The frame 22 is provided so as to stand and surround the lifting/lowering table 23 and lifts or lowers such a lifting/lowering table 23 in a vertical direction. The base table 24 is provided on the lifting/lowering table 23 and is rotated around a vertical axis by the lifting/lowering table 23.

The two forks 25 are provided on the base table 24 so as to mutually overlap one above another and the base table 24 moves each of such forks 25 independently forward or backward between a backward travel position and a forward travel position on the base table 24.

The left/right driving unit 21, the frame 22, the lifting/lowering table 23, and the base table 24 include a (non-illustrated) driving mechanism that is composed of a motor, a timing belt, and a pulley in such a manner that it is possible to thus move each unit. Such a motor includes an encoder in such a manner that it is possible for the controller 6 (see FIG. 1) to detect a position of each unit.

Furthermore, as illustrated in FIG. 5, the cleaning unit 16 includes a substrate processing unit 72 and a recovery cup 74 as described above. Moreover, a lifting/lowering pin(s) 76 is/are provided on the substrate processing unit 72.

Such a lifting/lowering pin(s) 76 is/are three lifting/lowering pins that are capable of lifting and lowering and are provided on an inner side of the recovery cup 74. The lifting/lowering pin(s) 76 deliver(s) a wafer W between a fork 25 that is positioned on the recovery cup 74 and the substrate processing unit 72.

The cleaning unit 16 has a perpendicular wall unit 48 that separates the cleaning unit 16 from a transfer unit 15. It is possible for such a wall unit 48 to prevent or reduce influencing of a gas stream in the transfer unit 15 on a process that is executed in an inside of the cleaning unit 16.

The wall unit 48 is provided with a carry-in port 49 where a wafer W is carried in/out of the substrate processing unit 72. Furthermore, a first detection unit 51, a second detection unit 52, and a third detection unit 53 that are transmission-type optical sensors are provided near the carry-in port 94.

The first detection unit 51 and the second detection unit 52 are provided side by side along leftward and rightward directions in such a manner that the first detection unit 51 is provided on a left side relative to the transfer unit 15 to the cleaning unit 16. The first detection unit 51 and the third detection unit 53 are provided side by side along frontward and backward directions in such a manner that the first detection unit 51 is provided on a back side thereof. That is, the third detection unit 53 is provided on an inner side or an outer side (an inner side in the figure) of the cleaning unit 16 relative to the first detection unit 51 and the second detection unit 52.

Figure 6:
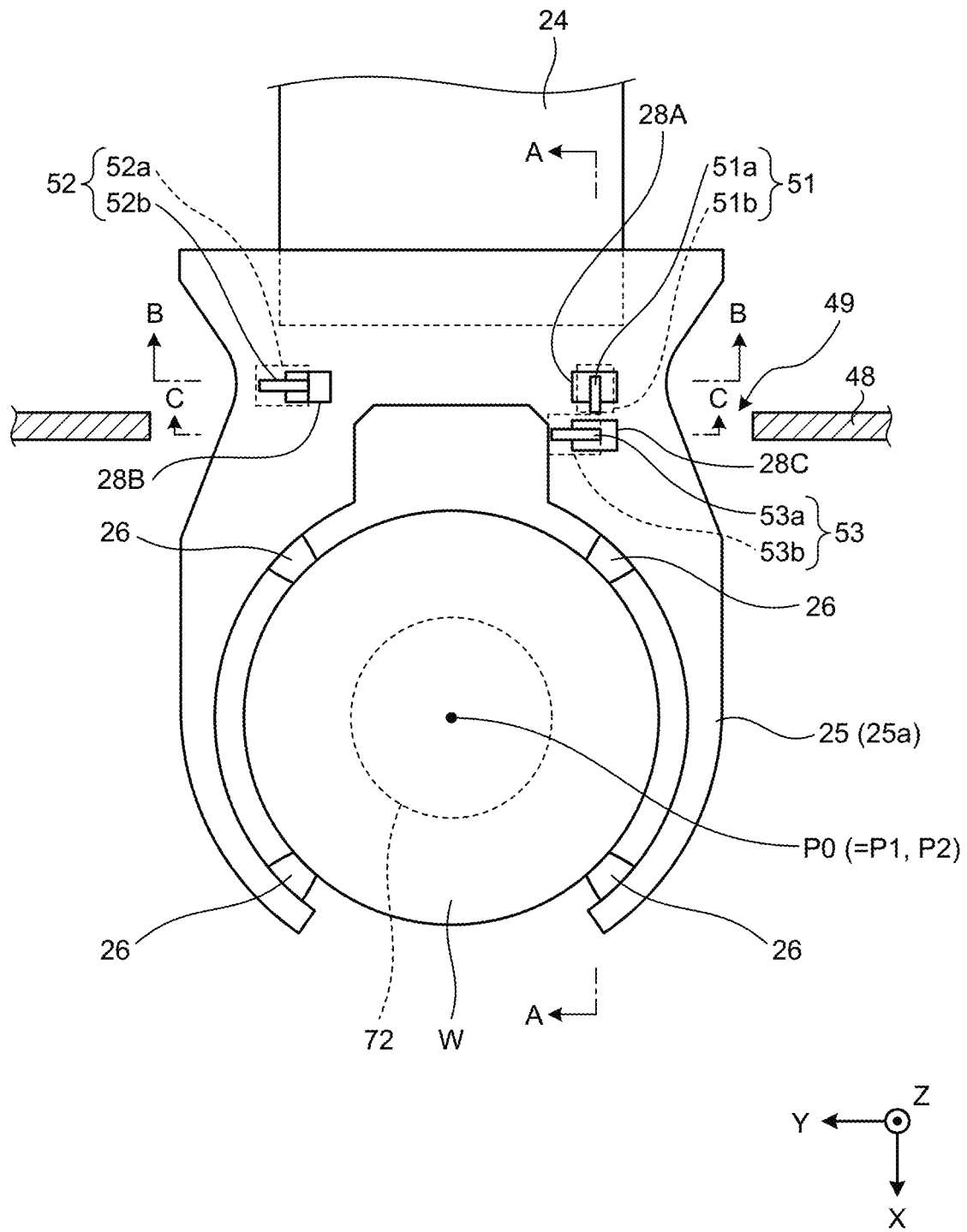
FIG. 6 is a plan view that illustrates a first detection unit, a second detection unit, and a third detection unit according to an embodiment.

FIG. 6 is a plan view that illustrates a first detection unit 51, a second detection unit 52, and a third detection unit 53 according to an embodiment. Additionally, FIG. 6 also illustrates a fork 25 that travels into a cleaning unit 16 in a forward direction through a carry-in port 49 in order to carry a wafer W therein and deliver the wafer W to a substrate processing unit 72.

As illustrated in FIG. 6, the first detection unit 51 has a light-emitting unit 51a and a light-receiving unit 51b that are arranged side by side in upward and downward directions. The light-emitting unit 51a is provided below the carry-in port 49 and the light-receiving unit 51b is provided above the carry-in port 49.

Furthermore, the light-emitting unit 51a emits light upward. The light-receiving unit 51b has a plurality of (for example, 1024) light-receiving elements and such a plurality of light-receiving elements are arranged side by side along forward and backward directions (directions of an X-axis).

The second detection unit 52 has a light-emitting unit 52a and a light-receiving unit 52b that are arranged side by side in upward and downward directions. The light-emitting unit 52a is provided below the carry-in port 49 and the light-receiving unit 52b is provided above the carry-in port 49.

Furthermore, the light-emitting unit 52a emits light upward. The light-receiving unit 52b has a plurality of (for example, 1024) light-receiving elements and such a plurality of light-receiving elements are arranged side by side along leftward and rightward directions (directions of a Y-axis).

The third detection unit 53 has a light-emitting unit 53a and a light-receiving unit 53b that are arranged side by side in upward and downward directions. The light-emitting unit 53a is provided below the carry-in port 49 and the light-receiving unit 53b is provided above the carry-in port 49.

Furthermore, the light-emitting unit 53a emits light upward. The light-receiving unit 53b has a plurality of (for example, 1024) light-receiving elements and such a plurality of light-receiving elements are arranged side by side along leftward and rightward directions (directions of a Y-axis).

Figure 7:
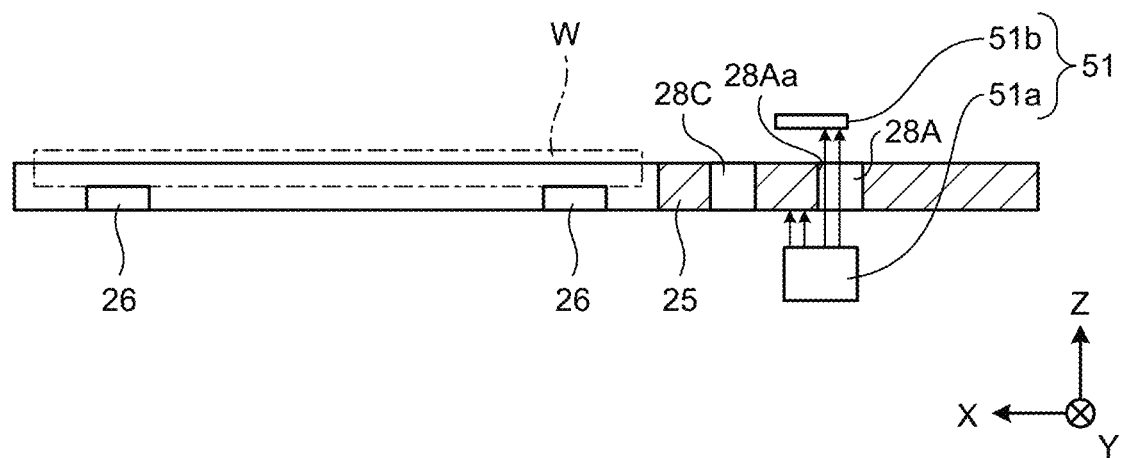
FIG. 7 is an arrow cross-sectional view along line A-A as illustrated in FIG. 6.

FIG. 7 is an arrow cross-sectional view along line A-A as illustrated in FIG. 6 and is a diagram for explaining an operation of a first detection unit 51. Additionally, FIG. 7 schematically illustrates, by an arrow, a light path(s) that is/are formed by a light-emitting unit 51a.

As illustrated in FIG. 7, the light-emitting unit 51a is arranged so as to irradiate, with light, a through-hole 28A of a fork 25 that travels to an upper side of a substrate processing unit 72 (see FIG. 5) in order to deliver a wafer W, and an edge part 28Aa of such a through-hole 28A on a front side (a side of a positive direction of an X-axis) thereof.

In the first detection unit 51, a size of a region where light is received by a light-receiving unit 51b is changed depending on a position of the edge part 28Aa of the through-hole 28A on a front side thereof. Hence, the light-receiving unit 51b outputs a signal that is dependent on a size of such a light-receiving region to a controller 6.

It is possible for the controller 6 to detect a position of the edge part 28Aa of the through-hole 28A on a front side thereof (that will also be called, simply, the edge part 28Aa of the through-hole 28A below) in a direction of an X-axis based on such an output signal. That is, it is possible for the first detection unit 51 to detect a position of the fork 25 in a direction of travel thereof relative to the substrate processing unit 72.

Figure 8:
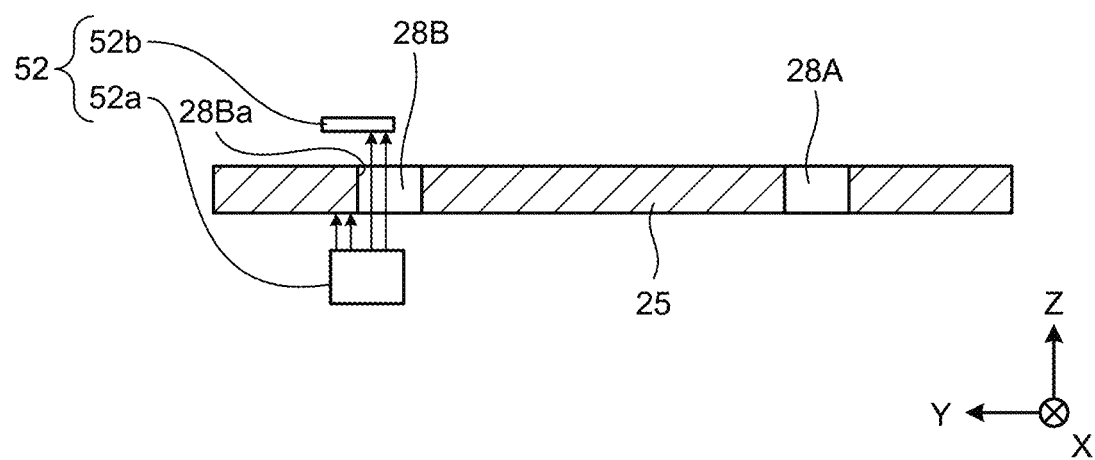
FIG. 8 is an arrow cross-sectional view along line B-B as illustrated in FIG. 6.

FIG. 8 is an arrow cross-sectional view along line B-B as illustrated in FIG. 6 and is a diagram for explaining an operation of a second detection unit 52. Additionally, FIG. 8 schematically illustrates, by an arrow, a light path(s) that is/are formed by a light-emitting unit 52a.

As illustrated in FIG. 8, the light-emitting unit 52a is arranged so as to irradiate, with light, a through-hole 28B of a fork 25 that travels to an upper side of a substrate processing unit 72 (see FIG. 5) in order to deliver a wafer W, and an edge part 28Ba of such a through-hole 28B on a right side (a side of a positive direction of a Y-axis) thereof.

In the second detection unit 52, a size of a region where light is received by a light-receiving unit 52b is changed depending on a position of the edge part 28Ba of the through-hole 28B on a right side thereof. Hence, the light-receiving unit 52b outputs a signal that is dependent on a size of such a light-receiving region to a controller 6.

It is possible for the controller 6 to detect a position of the edge part 28Ba of the through-hole 28B on a right side thereof (that will also be called, simply, the edge part 28Ba of the through-hole 28B below) in a direction of a Y-axis based on such an output signal. That is, it is possible for the second detection unit 52 to detect a position of the fork 25 in a direction that is perpendicular to a direction of travel thereof relative to the substrate processing unit 72.

As has been explained above, it is possible for the first detection unit 51 and the second detection unit 52 to detect positions of the fork 25 on two horizontal axes that are orthogonal to one another relative to the substrate processing unit 72.

Figure 9:
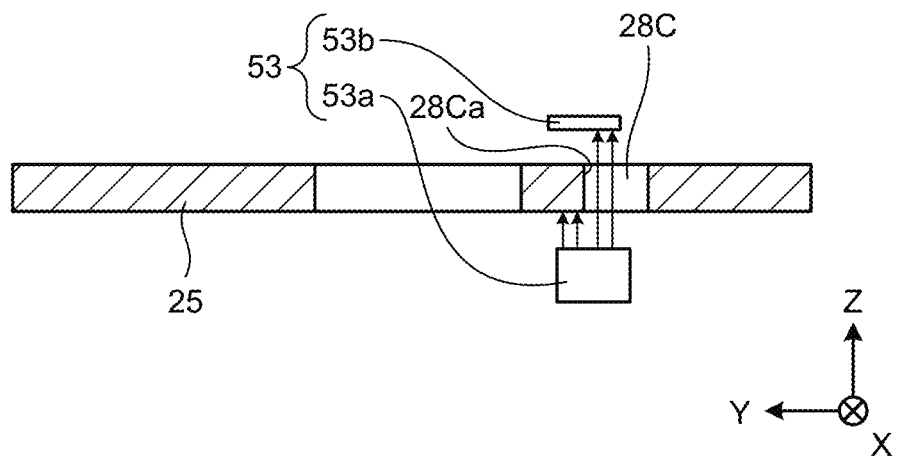
FIG. 9 is an arrow cross-sectional view along line C-C as illustrated in FIG. 6.

FIG. 9 is an arrow cross-sectional view along line C-C as illustrated in FIG. 6 and is a diagram for explaining an operation of a third detection unit 53. Additionally, FIG. 9 schematically illustrates, by an arrow, a light path(s) that is/are formed by a light-emitting unit 53a.

As illustrated in FIG. 9, the light-emitting unit 53a is arranged so as to irradiate, with light, a through-hole 28C of a fork 25 that travels to an upper side of a substrate processing unit 72 (see FIG. 5) in order to deliver a wafer W, and an edge part 28Ca of such a through-hole 28C on a right side (a side of a positive direction of a Y-axis) thereof.

In the third detection unit 53, a size of a region where light is received by a light-receiving unit 53b is changed depending on a position of the edge part 28Ca of the through-hole 28C on a right side thereof. Hence, the light-receiving unit 53b outputs a signal that is dependent on a size of such a light-receiving region to a controller 6.

It is possible for the controller 6 to detect a position of the edge part 28Ca of the through-hole 28C on a right side thereof (that will also be called, simply, the edge part 28Ca of the through-hole 28C below) in a direction of a Y-axis based on such an output signal. That is, it is possible for the third detection unit 53 to detect a position of the fork 25 in a direction that is perpendicular to a direction of travel thereof relative to the substrate processing unit 72.

Herein, the third detection unit 53 according to an embodiment is cooperated with the second detection unit 52, so that it is possible to detect an inclination of a rotational axis of the fork 25 relative to the substrate processing unit 72. A detail(s) of such an inclination detecting process for a rotational axis will be explained with reference to FIG. 10 and FIG. 11.

Figure 10:
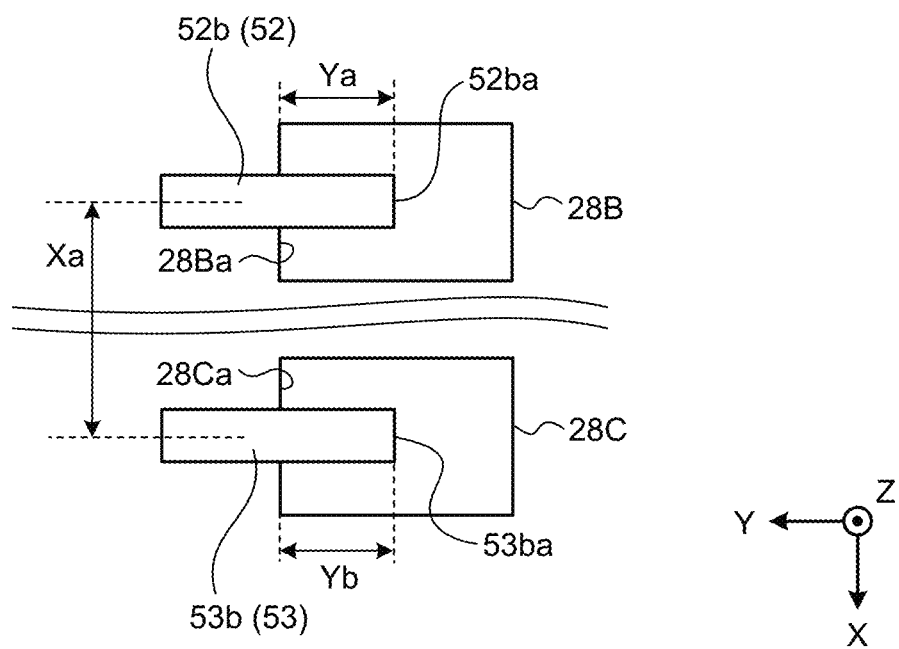
FIG. 10 is a diagram for explaining an inclination detecting process according to an embodiment.
Figure 11:
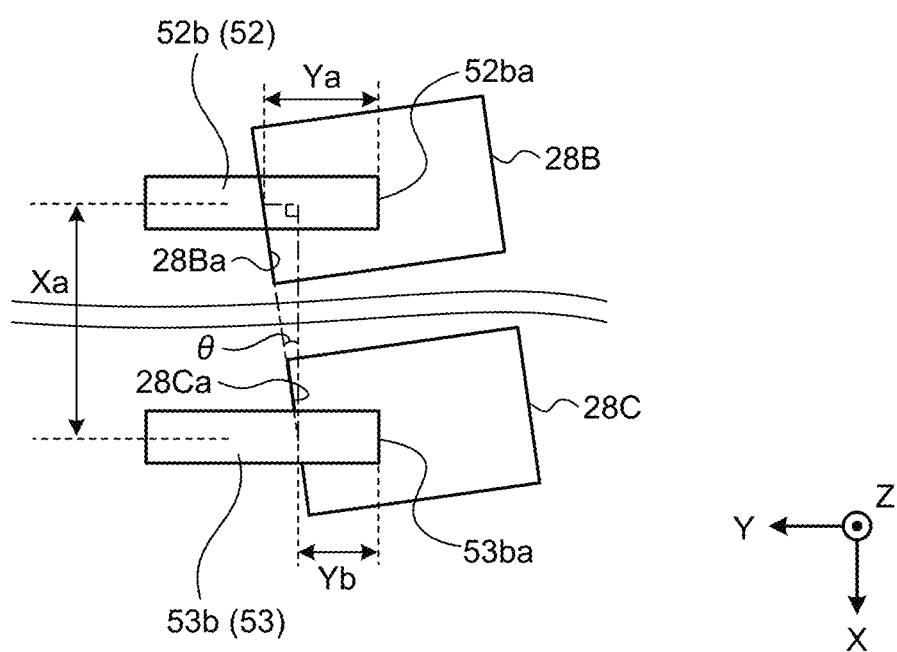
FIG. 11 is a diagram for explaining an inclination detecting process according to an embodiment.

FIG. 10 and FIG. 11 are diagrams for explaining an inclination detecting process according to an embodiment. Additionally, FIG. 10 and FIG. 11 illustrate a second detection unit 52 and a third detection unit 53 side by side and one above another, for facilitating understanding thereof.

Furthermore, FIG. 10 illustrates a case where a rotational axis of a fork 25 (see FIG. 6) is not inclined relative to a substrate processing unit 72 (see FIG. 6) (that is, an inclination angle thereof is 0 (rad)). As illustrated in FIG. 10, it is possible for the second detection unit 52 to obtain a distance Ya between an edge part 28Ba of a through-hole 28B and an end part 52ba of a light-receiving unit 52b based on a size of a light-receiving region on the light-receiving unit 52b.

Similarly, it is possible for the third detection unit 53 to obtain a distance Yb between an edge part 28Ca of a through-hole 28C and an end part 53ba of a light-receiving unit 53b based on a size of a light-receiving region on the light-receiving unit 53b.

Herein, the light-receiving unit 52b and the light-receiving unit 53b are arranged along a direction of a Y-axis, so that a distance Ya and a distance Yb as described above are distances between the edge part 28Ba (28Ca) and the end part 52ba (53ba) in a direction of a Y-axis. Furthermore, a distance between the light-receiving unit 52b and the light-receiving unit 53b in a direction of an X-axis is provided as a distance Xa.

For example, in an embodiment, in a case where a rotational axis of the fork 25 is not inclined relative to the substrate processing unit 72, the second detection unit 52, the third detection unit 53, and the through-holes 28, 28C are arranged in such a manner that a distance Ya and a distance Yb are equal as illustrated in FIG. 10.

FIG. 11 illustrates a case where a rotational axis of a fork 25 (see FIG. 6) is inclined relative to a substrate processing unit 72 (see FIG. 6). As illustrated in FIG. 11, in a case where a rotational axis of the fork 25 is inclined, a positional relationship between a through-hole 28B and a through-hole 28C that are provided on such a fork 25 is changed, so that a distance Ya and a distance Yb are provided as mutually different values.

Then, also as illustrated in FIG. 11, it is possible to calculate an inclination angle θ (rad) of a rotational axis of the fork 25 relative to the substrate processing unit 72 according to undermentioned formula (1).

$$\theta = \tan^{-1}((Ya - Yb)/Xa) \quad (1)$$

As has been explained above, the third detection unit 53 according to an embodiment is cooperated with the second detection part 52, so that it is possible to obtain an inclination angle θ of a rotational axis of the fork 25 relative to the substrate processing unit 72.

Carrying-In Process for Wafer

Next, a detail(s) of a process that carries a wafer W in a substrate processing unit 72 of a cleaning unit 16 by using a substrate transfer device 17 will be explained with reference to FIG. 6 and the like as explained previously.

A position of a fork 25 to deliver a wafer W to the substrate processing unit 72 is preliminarily set where such a set position is provided as a delivery initial position. In more detail, a forward travel position of the fork 25 on a base table 24 and an orientation of the fork 25 are preliminarily set as a delivery initial position.

In other words, a pulse number (an encoder value) that is output from each of encoders that are provided on motors that are respectively included in the base table 24 that travels the fork 25 forward or backward, the fork 25, and a lifting/lowering table 23 (see FIG. 5) is set preliminarily. Thus, a position of the fork 25 on the base table 24 and an orientation of the fork 25 that are set preliminarily are provided as a "forward travel set position" and a "set orientation", respectively.

In a case where a wafer W is held at a predetermined reference holding position on the fork 25 and the fork 25 is positioned at such a delivery initial position, a center of the wafer W on the substrate processing unit 72 is positioned on a rotational axis of such a substrate processing unit 72. FIG. 6 illustrates a state where the fork 25 and a wafer W are thus positioned at a delivery initial position and a reference position, respectively.

A subsequent drawing(s) illustrate(s) a central point P0 of a wafer W in a case where it is held at a reference holding position, a central point P1 of a wafer W that is held actually, and a rotational axis P2 of the substrate processing unit 72. Additionally, an orientation of the fork 25 is an orientation of a central point P0 that is viewed from a rotational axis of the fork 25.

For example, in a case where a wafer W is held by the fork 25 so as to be shifted from a reference holding position, a controller 6 moves, when the wafer W is delivered to the substrate processing unit 72, the fork 25 in such a manner that the fork 25 is shifted from a forward travel set position and a set orientation in order to compensate for such a shift.

That is, the controller 6 calculates an encoder value that is corrected by an amount that corresponds to a shift of a wafer W from a preliminarily set encoder value, and the fork 25 is moved depending on such a corrected encoder value. In the present disclosure, such a moved position of the fork 25 is provided as a delivery temporary position.

Then, the controller 6 controls the substrate transfer device 17 so as to move the fork 25 that holds a wafer W in a forward direction (a positive direction of an X-axis) and carry the wafer W in an upper side of the substrate processing unit 72 in the cleaning unit 16.

Then, a first detection unit 51 detects a position of an edge part 28Aa of a through-hole 28A that is provided on the fork 25, a second detection unit 52 detects a position of an edge part 28Ba of a through-hole 28B, and a third detection unit 53 detects a position of an edge part 28Ca of a through-hole 28C.

Then, the controller 6 obtains a shift between a detected position of the edge part 28Aa, 28Ba and a position that should be detected for the edge part 28Aa, 28Ba where correcting of the fork 25 from a delivery initial position to a delivery temporary position is added thereto.

That is, the controller 6 detects a positional shift between a set delivery temporary position and an actual position of the fork 25.

Then, the controller 6 further corrects an orientation of the fork 25 that is a set orientation and further corrects a position of the fork 25 on the base table 24 that is a forward travel set position, so as to remove such a positional shift.

That is, the controller 6 moves the fork 25 so as to further correct an encoder value that is output from each encoder that is a preliminarily set encoder value, by a positional shift of the fork 25. Then, delivery of a wafer W is executed in a state where a central point P1 of the wafer W is positioned on a rotational axis P2 of the substrate processing unit 72.

In a process that corrects a positional shift of the fork 25 as explained above, it is assumed that the process is executed with reference to only a positon of the fork 25 relative to the substrate processing unit 72 in a direction of an X-axis and a position thereof in a direction of a Y-axis while an orientation of the fork 25 relative to the substrate processing unit 72 is not shifted.

In such a case, a degree of accuracy of correction is decreased depending on an amount of a shift of an orientation of the fork 25. That is because the controller 6 rotates the fork 25 so as to execute correction of a position thereof in a direction of a Y-axis, and in a case where an orientation of the fork 25 is shifted, correction of the position thereof in a direction of a Y-axis is insufficient and a position thereof in a direction of an X-axis is shifted unexpectedly.

However, in an embodiment, the third detection unit 53 is provided on the cleaning unit 16, so that it is possible to correct a positional shift of the fork 25, also with reference to an orientation (an inclination angle θ) of the fork 25 in a process that corrects a positional shift of the fork 25.

Therefore, according to an embodiment, it is possible to improve a degree of accuracy of centering at a time when a wafer W is placed on the substrate processing unit 72 in the cleaning unit 16.

For a cause of a positional shift of the fork 25, for example, pivoting a base table 24 of the substrate transfer device 17 while such a base table 24 moves horizontally, so that such horizontal movement is influenced by inertia thereof, is provided. In an embodiment, it is possible to correct a positional shift of the fork 25 as explained above, so that it is possible to prevent or reduce generation of abnormality in delivery of a wafer W that is provided by a cause as described above.

Transferring Process for Wafer

Figure 12:
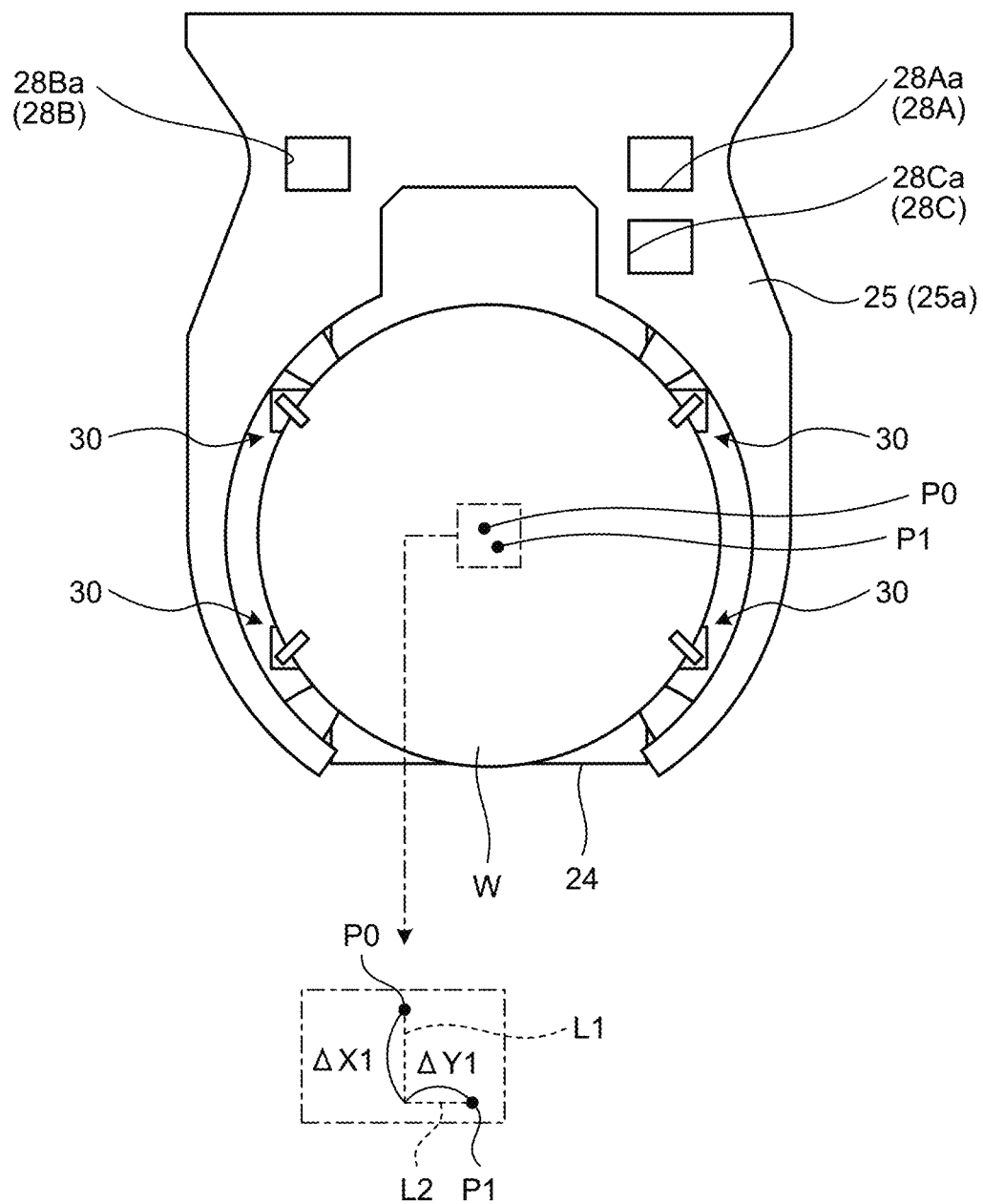
FIG. 12 is a diagram for explaining a carrying-in process for a wafer according to an embodiment.
Figure 13:
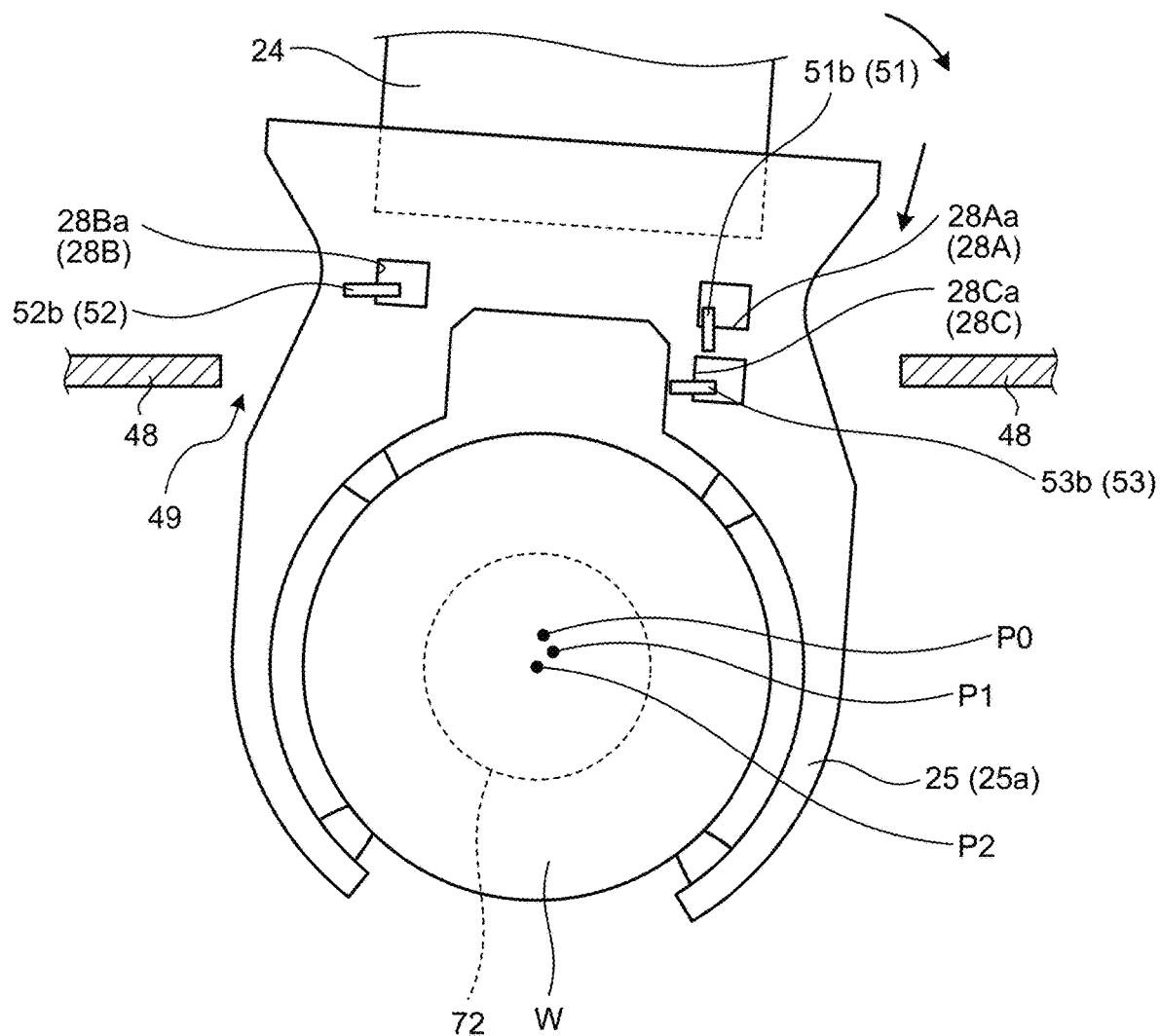
FIG. 13 is a diagram for explaining a carrying-in process for a wafer according to an embodiment.
Figure 14:
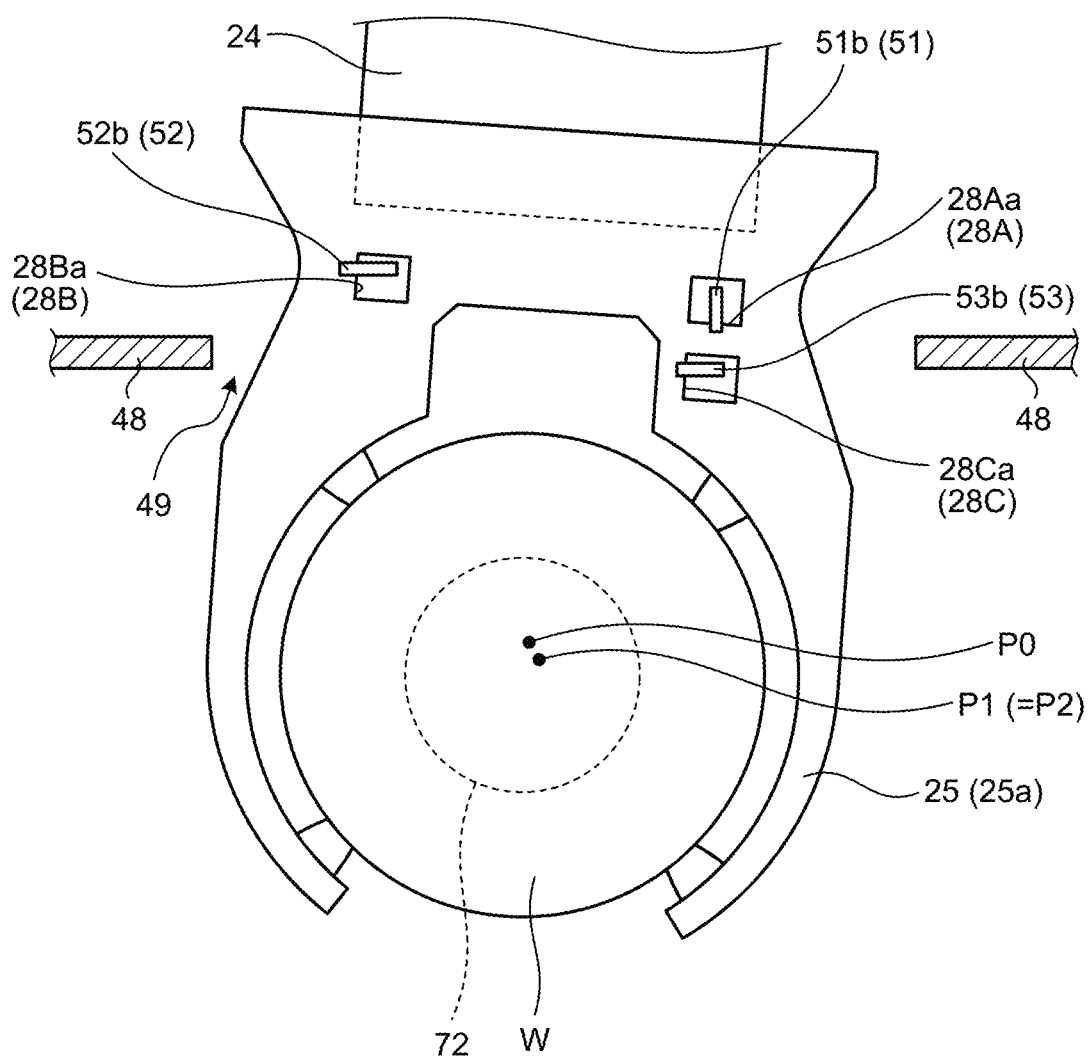
FIG. 14 is a diagram for explaining a carrying-in process for a wafer according to an embodiment.

Next, a detail(s) of a process that carries a wafer W in a cleaning unit 16 will be explained with reference to FIG. 12 to FIG. 14. FIG. 12 to FIG. 14 are diagrams for explaining a carrying-in process for a wafer W according to an embodiment.

Additionally, FIG. 12 enlarges and illustrates a region that includes central points P0, P1 of a wafer W at a tip of an arrow of a dashed line for simplicity of understanding thereof. Furthermore, a position of an edge part 28Aa of a through-hole 28A and a position of an edge part 28Ba of a though-hole 28B that are detected at a delivery initial position of a fork 25 are provided as reference positions of the edge parts 28Aa, 28Ba, respectively.

First, a controller 6 positions a base table 24 on a front side of a delivery unit 14, lifts the base table 24 in a state where the fork 25 is positioned at a forward travel position thereof, delivers a wafer W from the delivery unit 14 to the fork 25, and holds it thereon. Then, the controller 6 moves the fork 25 to a backward travel position thereof.

Then, the controller 6 calculates a position of a central point P1 of a wafer W based on a detection signal from each sensor for wafer detection 30, and detects an amount of a shift between such a central point P1 and a central point P0 of the wafer W that is held at a reference holding position as described above.

For a specific amount of a shift, the controller 6 calculates an amount of a shift ΔX1 in a horizontal direction along a first straight line L1 that connects a rotational center of the fork 25 and a central point P1 and an amount of a shift ΔY1 in a horizontal direction along a second straight line L2 that is orthogonal to such a first straight line L1. Thereby, it is possible to detect a position of a wafer W on the fork 25.

Then, the controller 6 moves a frame 22 to a predetermined position by a left/right driving unit 21 of a substrate transfer device 17. That is, the controller 6 moves the frame 22 so as to output a predetermined encoder value from a motor of the left/right driving unit 21. Additionally, the controller 6 rotates the fork 25 in a set direction in parallel to such movement of the frame 22.

Then, the controller 6 controls the substrate transfer device 17 so as to execute forward travel of the fork 25 and rotation of the fork 25 in order to carry a wafer W in a substrate processing unit 72. In an embodiment, such forward travel of the fork 25 and rotation of the fork 25 are executed, for example, in parallel.

Herein, the controller 6 executes a forward traveling process for the fork 25 in such a manner that the fork 25 is positioned at a position that shifts from a forward travel set position by an amount that corresponds to an amount of a shift ΔX1. Similarly, the controller 6 executes a rotating process for the fork 25 in such a manner that the fork 25 is oriented in a direction that shifts from a set orientation by an amount that corresponds to an amount of a shift ΔY1.

That is, in an embodiment, as illustrated in FIG. 13, the fork 25 is moved to and immobilized at a delivery temporary position as described above in such a manner that correction is executed by amounts of a shift ΔX1, ΔY1 so as to align a central point P1 of a wafer W and a rotational axis P2 of the substrate processing unit 72.

Then, the controller 6 controls a first detection unit 51, a second detection unit 52, and a third detection unit 53 so as to detect positions of the edge part 82Aa of the through-hole 28A, the edge part 28Ba of the though-hole 28B, and an edge part 28Ca of a though-hole 28C of the fork 25.

Furthermore, a reference position of the edge part 82Aa of the through-hole 28A is corrected by an amount that corresponds to an amount of a shift ΔX1, so as to acquire a position that should be detected for the edge part 82Aa of the through-hole 28A.

Similarly, a reference position of the edge part 28Ba of the though-hole 28B is corrected by an amount of a change of an orientation of the fork 25 from a set orientation, that is, an amount that corresponds to an amount of a shift ΔY1, so as to acquire a position that should be detected for the edge part 82Ba of the through-hole 28B.

Then, the controller 6 calculates, for the through-hole 28A, an amount of shift between a position that should be detected and a detected position (that will be provided as ΔX2 below) and calculates, for the through-hole 28B, an amount of a shift between a position that should be detected and a detected position (that will be provided as ΔY2 below). Additionally, such an amount of a shift ΔX2, ΔY2 is not illustrated in the drawing(s).

Herein, in an embodiment, the controller 6 calculates an inclination angle θ of a rotational axis of the fork 25 relative to the substrate processing unit 72 based on detected positions of the edge part 28Ba of the though-hole 28B and the edge part 28Ca of the though-hole 28C before such a calculating process for amounts of a shift ΔX2, ΔY2.

Then, the controller 6 executes a calculating process for amounts of a shift ΔX2, ΔY2, while an inclination angle θ of a rotational axis of the fork 25 relative to the substrate processing unit 72 is used as a parameter, at a time of the calculation process for amounts of a shift ΔX2, ΔY2.

Thereby, it is possible to improve a degree of accuracy of calculation of amounts of a shift ΔX2, ΔY2.

Therefore, according to an embodiment, it is possible to improve a degree of accuracy of centering at a time when a wafer W is placed on the substrate processing unit 72 in the cleaning unit 16.

Then, the controller 6 controls the substrate transfer device 17 so as to execute forward or backward travel of the fork 25 by an amount that corresponds to ΔX2 and rotation of the fork 25 by an amount that corresponds to ΔY2, for example, in parallel. Thereby, it is possible for the controller 6 to move the fork 25 in such a manner that a central point P1 of a wafer W is positioned on a rotational axis P2 of the substrate processing unit 72.

That is, as illustrated in FIG. 14, it is possible for the controller 6 to move the fork 25 from a delivery temporary position as described above to a delivery position for a wafer W that is newly set based on such a temporary position and amounts of a shift ΔX2, ΔY2.

Then, the controller 6 lifts a lifting/lowering pin(s) 76 of the cleaning unit 16 so as to deliver a wafer W from the fork 25 to such a lifting/lowering pin(s) 76. Then, the controller 6 executes backward travel of the fork 25 and lowering of the lifting/lowering pin(s) 76 in such an order, so as to deliver a wafer W to the substrate processing unit 72.

Additionally, before one fork 25 executes a carrying-in process for a wafer W or simultaneously therewith, another fork 25 executes a carrying-out process for a wafer W that is held by the substrate processing unit 72, although it is omitted in an explanation as described above.

Furthermore, data that are needed to execute correction of a position of the fork 25 as explained above, such as a delivery initial position and/or a reference holding position, are preliminarily stored in a storage 7 of a control device 5 and control of an operation of the fork 25 is executed based on such data.

As explained above, in an embodiment, it is possible to transfer a wafer W in such a manner that a central position P1 of the wafer W is aligned with a central axis P2 of the substrate processing unit 72. Thereby, in a case where, for example, a film on a peripheral part of a wafer W is eliminated in the cleaning unit 16, it is possible to prevent a width for elimination from being shifted from a set value, so that it is possible to improve a yield of the wafer W.

Then, in an embodiment, the third detection unit 53 is provided in addition to the first detection unit 51 and the second detection unit 52, so that it is possible to correct a positional shift of the fork 25 also with reference to an orientation (an inclination angle θ) of the fork 25. Therefore, according to an embodiment, it is possible to improve a degree of accuracy of centering at a time when a wafer W is placed on the substrate processing unit 72.

Furthermore, in an embodiment, in addition to the second detection unit 52, it is also possible for the third detection unit 53 to detect a position of the fork 25 relative to the substrate processing unit 72 in a direction that is perpendicular to a direction of travel thereof (that is, a direction of a Y-axis).

Thereby, even in a case where a defect is caused in the second detection unit 52, it is possible for the third detection unit 53 to execute a process that is executed by using such a second detection unit 52. Therefore, according to an embodiment, it is possible to improve reliability of a substrate processing system 1.

Furthermore, in an embodiment, it is preferable to arrange the third detection unit 53 so as not to be along a direction of a Y-axis relative to the second detection unit 52. Thereby, in a case where a rotational axis of the fork 25 is inclined, it is possible to provide a distance Ya (see FIG. 11) that is measured by the second detection unit 52 and a distance Yb (see FIG. 11) that is measured by the third detection unit 53 as mutually different values.

Therefore, according to an embodiment, it is possible to obtain an inclination angle θ of a rotational axis of the fork 25 relative to the substrate processing unit 72 accurately.

Furthermore, in an embodiment, it is preferable to provide the first detection unit 51 and the second detection unit 52 so as to be adjacent to a carry-in port 94 and to provide the third detection unit 53 on an inner side or an outer side of the first detection unit 51 and the second detection unit 52 relative to the substrate processing unit 72.

Thereby, it is possible to measure a position and an inclination angle θ of the fork 25 at a time when a process for carrying a wafer W in the substrate processing unit 72 is executed, without disturbing such a carrying-in process. Therefore, according to an embodiment, it is possible to carry a wafer W in the substrate processing unit 72 smoothly.

Furthermore, in an embodiment, the first detection unit 51 to the third detection unit 53 are optical sensors that have light-emitting units 51*a* to 53*a* and light-receiving units 51*b* to 53*b*, respectively. Then, in an embodiment, it is preferable to arrange the light-emitting units 51*a* to 53*a* and the light-receiving units 51*b* to 53*b* so as to interpose the through-holes 28A to 28C that are provided on the fork 25 at a time when a position of the fork 25 is detected.

Thereby, it is possible to measure a position and an inclination angle θ of the fork 25 at a time when a process for carrying a wafer W in the substrate processing unit 72 is executed, without disturbing such a carrying-in process, and accurately. Therefore, according to an embodiment, it is possible to carry a wafer W in the substrate processing unit 72 smoothly and accurately.

Furthermore, in an embodiment, it is preferable to provide each of the through-holes 28A to 28C that correspond to the first detection unit 51 to the third detection unit 53 on the fork 25. Thereby, it is possible to increase a degree of freedom of arrangement at a time when the first detection unit 51 to the third detection unit 53 are provided on the cleaning unit 16 and/or a degree of freedom of arrangement at a time when the through-holes 28A to 28C are provided on the fork 25.

Figure 15:
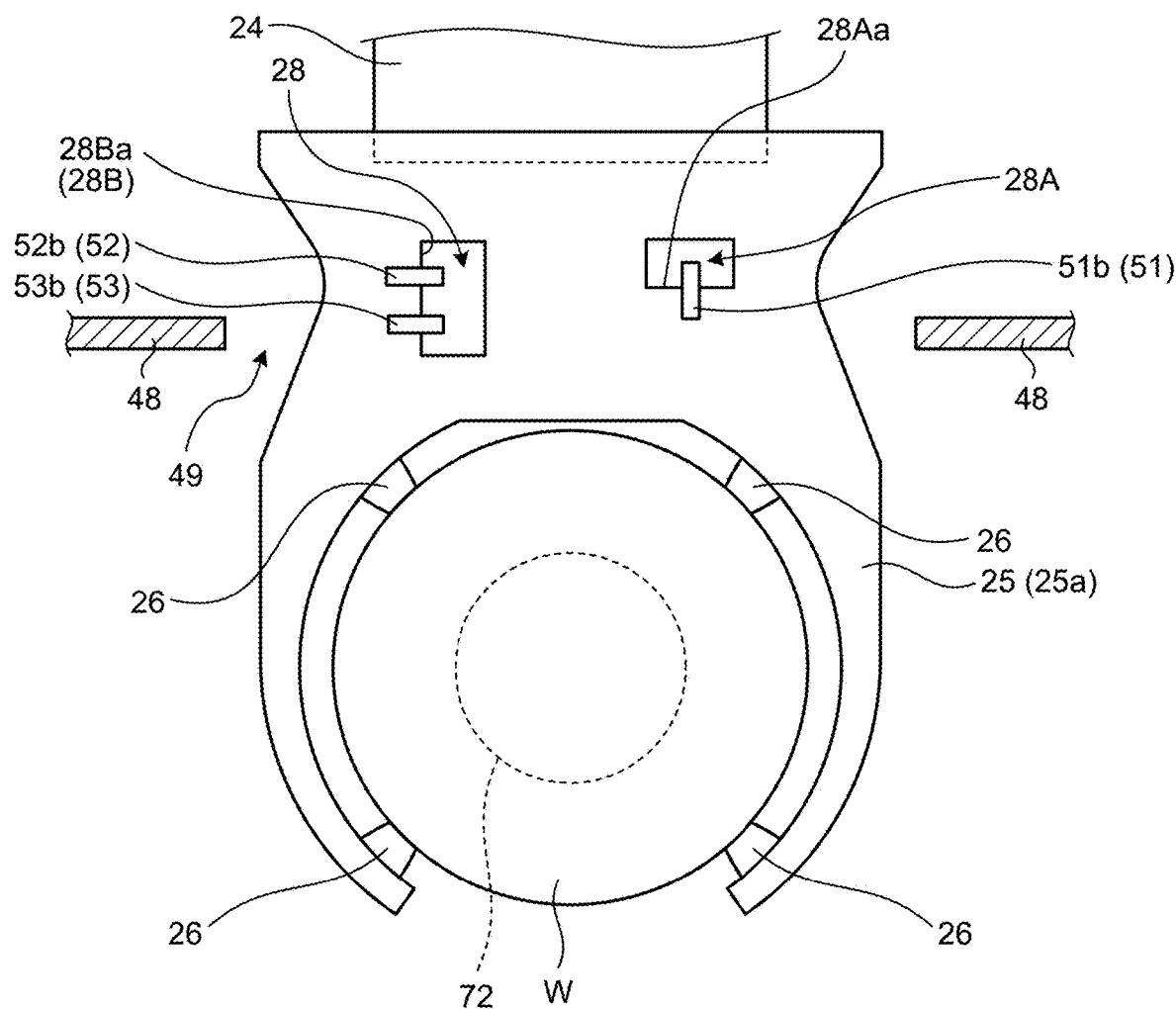
FIG. 15 is a plan view that illustrates a first detection unit, a second detection unit, a third detection unit, and a fork according to variation 1 of an embodiment.

Additionally, in an embodiment, a case where each of the through-holes 28A to 28C that correspond to the first detection unit 51 to the third detection unit 53 is provided on the fork 25 is not limiting. FIG. 15 is a plan view that illustrates a first detection unit 51, a second detection unit 52, a third detection unit 53, and a fork 25 according to variation 1 of an embodiment.

As illustrated in FIG. 15, in variation 1, a through-hole 28A is provided at a position that corresponds to the first detection unit 51 and a through-hole 28B is provided at a position that corresponds to the second detection unit 52, similarly to an embodiment. On the other hand, in variation 1, the third detection unit 53 is arranged so as to irradiate, with light, an edge part 28Ba of the through-hole 28B that is common to that of the second detection unit 52.

Even in such a case, it is possible to measure a position of the fork 25 relative to a substrate processing unit 72 in a direction of an X-axis, a position thereof in a direction of a Y-axis, and an inclination angle θ thereof, by using the first detection unit 51 to the third detection unit 53.

Figure 16:
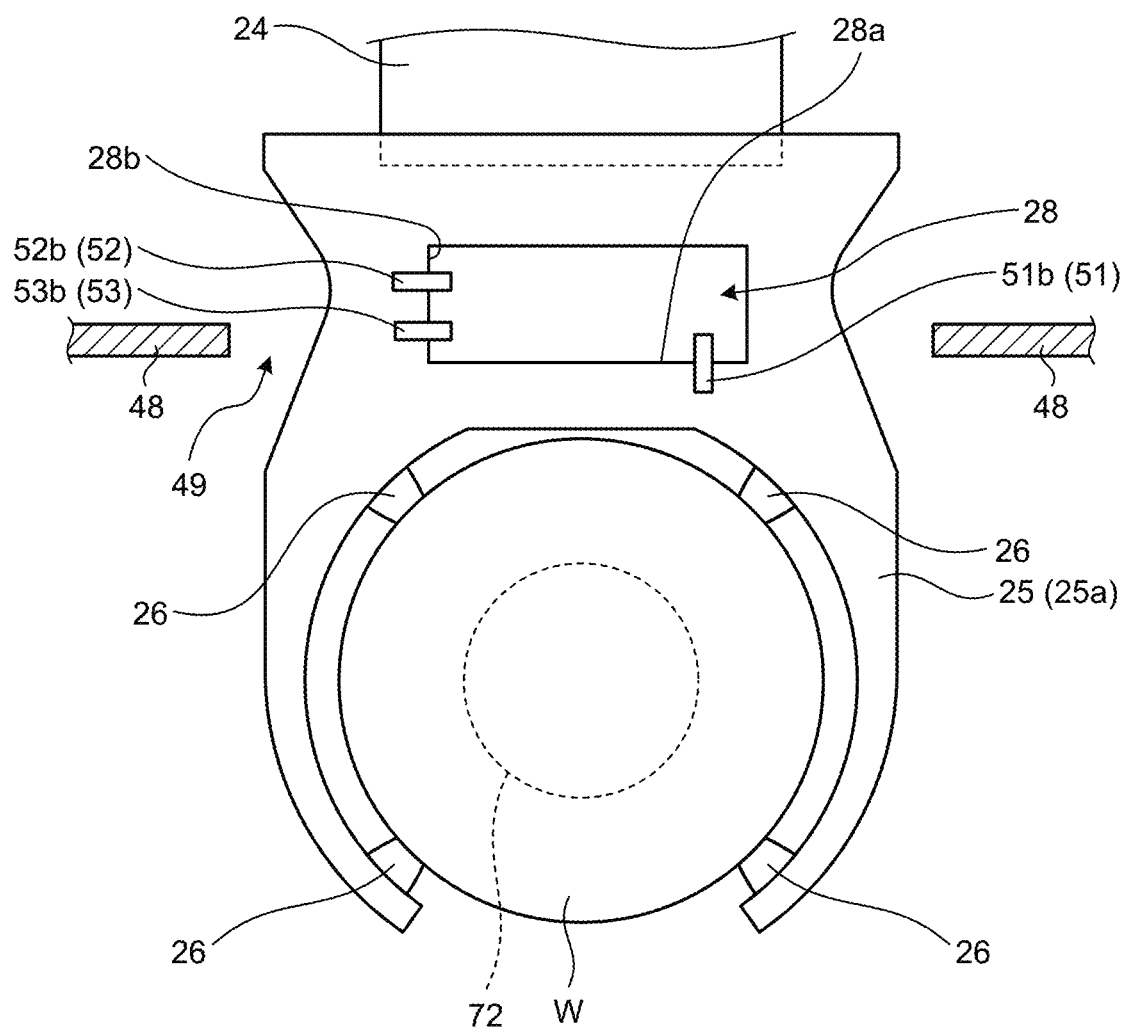
FIG. 16 is a plan view that illustrates a first detection unit, a second detection unit, a third detection unit, and a fork according to variation 2 of an embodiment.

FIG. 16 is a plan view that illustrates a first detection unit 51, a second detection unit 52, a third detection unit 53, and a fork 25 according to variation 2 of an embodiment. As illustrated in FIG. 16, in variation 2, a through-hole 28 that is common to those of the first detection unit 51 to the third detection unit 53 is provided on the fork 25.

Then, in variation 2, the first detection unit 51 is arranged so as to irradiate, with light, an edge part 28a of the through-hole 28 along a direction of a Y-axis and the second detection unit 52 and the third detection unit 53 are arranged so as to irradiate, with light, an edge part 28b of the through-hole 28 along a direction of an X-axis.

Even in such a case, it is possible to measure a position of the fork 25 relative to a substrate processing unit 72 in a direction of an X-axis, a position thereof in a direction of a Y-axis, and an inclination angle θ thereof, by using the first detection unit 51 to the third detection unit 53.

Additionally, in an embodiment as described above, the first detection unit 51 to the third detection unit 53 are not limited to optical sensors that have the light-emitting units 51a to 53a and the light-receiving units 51b to 53b. For example, positions of the edge parts 28Aa to 28Ca of the through-holes 28A to 28C may be detected by using a Charge Coupled Device (CCD) sensor(s), a Complementary Metal Oxide Semiconductor (CMOS) sensor(s), and/or the like.

Furthermore, in an embodiment as described above, targets that are detected by the first detection unit 51 to the third detection unit 53 are not limited to the edge parts 28Aa to 28Ca of the through-holes 28A to 28C and may be any targets as long as they are marks for detecting a position of the fork 25.

Furthermore, in an embodiment as described above, although correction of a shift in a direction of a Y-axis is executed by rotating the fork 25, it may be executed by moving the frame 22 of the substrate transfer device 17 in the direction of a Y-axis so as to shift a position of the fork 25 in the direction of a Y-axis.

A substrate processing apparatus (a substrate processing system 1) according to an embodiment includes a substrate processing unit 72, a substrate transfer unit (a fork 25), a first detection unit 51, a second detection unit 52, and a third detection unit 53. The substrate processing unit 72 holds and processes a substrate (a wafer W). The substrate transfer unit (the fork 25) has a rotational axis and carries the substrate (the wafer W) in the substrate processing unit 72. The first detection unit 51 detects a position of the substrate transfer unit (the fork 25) relative to the substrate processing unit 72 in a direction of travel thereof (a direction of an X-axis) when the substrate (the wafer W) is carried in the substrate processing unit 72 in the direction of travel (the direction of an X-axis). The second detection unit 52 detects a position of the substrate transfer unit (the fork 25) relative to the substrate processing unit 72 in a direction (a direction of a Y-axis) that is perpendicular to the direction of travel. The third detection unit 53 detects an inclination of the rotational axis of the substrate transfer unit (the fork 25) relative to the substrate processing unit 72. Thereby, it is possible to improve a degree of accuracy of centering at a time when a wafer W is placed on a substrate processing unit 72.

Furthermore, in the substrate processing apparatus (the substrate processing system 1) according to an embodiment, the third detection unit 53 is arranged so as not to be along the second detection unit 52 in a direction (a direction of a Y-axis) that is perpendicular to the direction of travel. Thereby, it is possible to obtain an inclination angle θ of a rotational axis of a fork 25 relative to a substrate processing unit 72 accurately.

Furthermore, in the substrate processing apparatus (the substrate processing system 1) according to an embodiment, the first detection unit 51 and the second detection unit 52 are provided so as to be adjacent to a carry-in port 49 of the substrate processing unit 72. Furthermore, the third detection unit 53 is provided on an inner side or an outer side of the first detection unit 51 and the second detection unit 52 relative to the substrate processing unit 72. Thereby, it is possible to carry a wafer W in a substrate processing unit 72 smoothly.

Furthermore, in the substrate processing apparatus (the substrate processing system 1) according to an embodiment, any of the first detection unit 51, the second detection unit 52, and the third detection unit 53 is an optical sensor that has a light-emitting unit(s) 51a to 53a and a light-receiving unit(s) 51b to 53b. Furthermore, the light-emitting unit(s) 51a to 53a and the light-receiving unit(s) 51b to 53b are arranged so as to interpose at least one through-hole 28A to 28C that is provided on the substrate transfer unit (the fork 25) when a position of the substrate transfer unit (the fork 25) is detected. Thereby, it is possible to carry a wafer W in a substrate processing unit 72 smoothly and accurately.

Furthermore, in the substrate processing apparatus (the substrate processing system 1) according to an embodiment, the at least one through-hole 28A to 28C includes a plurality of through-holes 28A to 28C that are provided at positions that correspond to the first detection unit 51, the second detection unit 52, and the third detection unit 53. Thereby, it is possible to increase a degree of freedom of arrangement at a time when a first detection unit 51 to a third detection unit 53 are provided on a cleaning unit 16 and/or a degree of freedom of arrangement at a time when through-holes 28A to 28C are provided on a fork 25.

Procedure of Process

Figure 17:
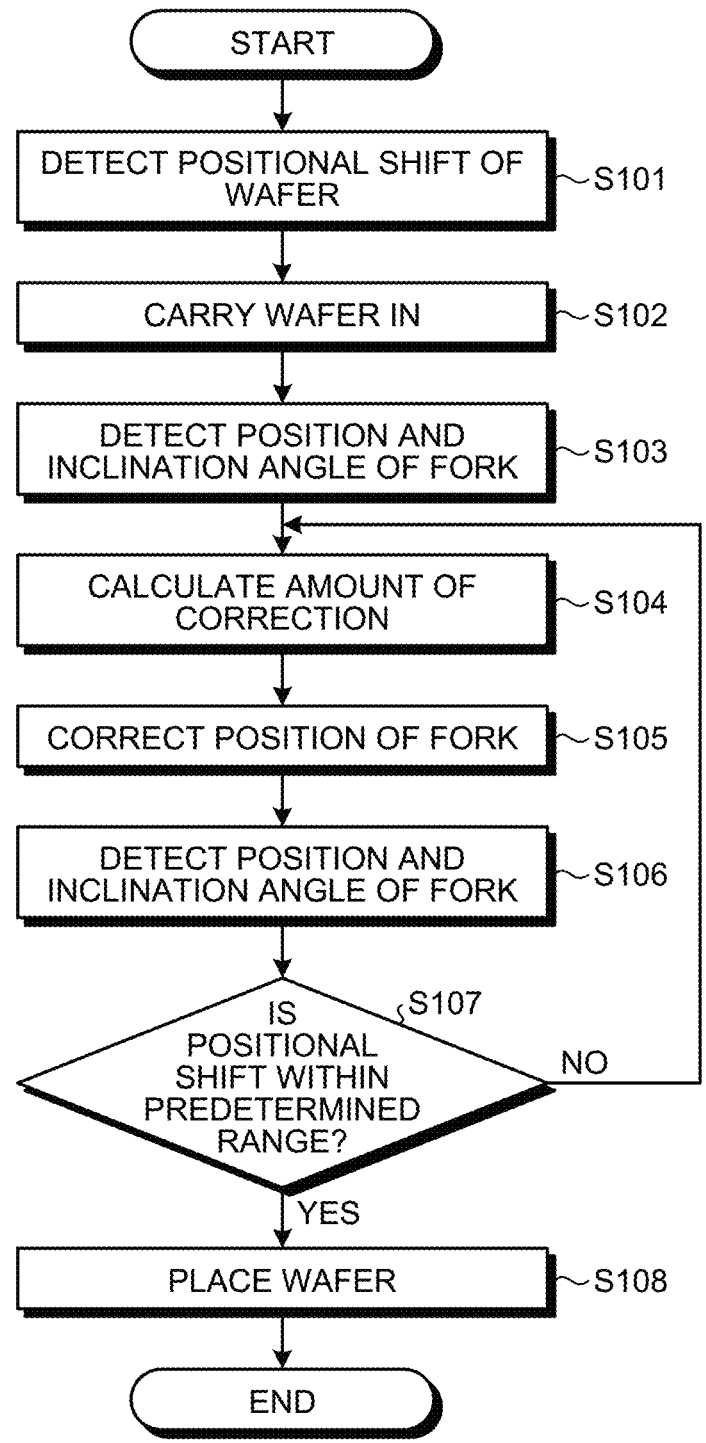
FIG. 17 is a flowchart that illustrates a procedure of a carrying-in process that is executed by a substrate processing system according to an embodiment.

Next, a procedure of a carrying-in process according to an embodiment will be explained with reference to FIG. 17. FIG. 17 is a flowchart that illustrates a procedure of a carrying-in process that is executed by a substrate processing system 1 according to an embodiment.

First, a controller 6 controls a sensor for wafer detection 30 so as to detect a positional shift of a wafer W relative to a fork 25 (step S101). Then, the controller 6 controls a substrate transfer device 17 so as to move the fork 25 that holds a wafer W in a forward direction and carry the wafer W in a substrate processing unit 72 in a cleaning unit 16 (step S102).

Then, the controller 6 controls a first detection unit 51 to a third detection unit 53 so as to detect positions (a position in a direction of an X-axis and a position in a direction of a Y-axis) and an inclination angle θ of the fork 25 relative to the substrate processing unit 72 (step S103). Then, the controller 6 calculates an amount of correction for a reference position based on each of detection values that are detected by the first detection unit 51 to the third detection unit 53 (step S104).

Then, the controller 6 operates the substrate transfer device 17 based on a calculated amount of correction, so as to correct a position of the fork 25 relative to the substrate processing unit 72 (step S105). Then, the controller 6 controls the first detection unit 51 to the third detection unit 53 so as to detect positions (a position in a direction of an X-axis and a position in a direction of a Y-axis) and an inclination angle θ of the fork 25 relative to the substrate processing unit 72 (step S106).

Then, the controller 6 determines whether or not a positional shift of the fork 25 is within a predetermined range based on positions (a position in a direction of an X-axis and a position in a direction of a Y-axis) of the fork 25 that are detected by the first detection unit 51 and the second detection unit 52 (step S107).

Herein, in a case where a positional shift of the fork 25 is within a predetermined range (step S107, Yes), the controller 6 controls the fork 25 and the cleaning unit 16 so as to place a wafer W on the substrate processing unit 72 (step S108) and complete a process.

On the other hand, in a case where a positional shift of the fork 25 is not within a predetermined range (step S107, No), a process at step S104 is returned to.

A substrate processing method according to an embodiment includes a detection step (step S103), a calculation step (step S104), and a correction step (step S105). The detection step (step S103) detects, by using a substrate transfer unit (a fork 25) that has a rotational axis, when a substrate (a wafer W) is carried in a substrate processing unit 72 in a direction of travel thereof (a direction of an X-axis), a position of the substrate transfer unit relative to the substrate processing unit in the direction of travel, a position of the substrate transfer unit relative to the substrate processing unit in a direction (a direction of a Y-axis) that is perpendicular to the direction of travel, and an inclination of the rotational axis of the substrate transfer unit relative to the substrate processing unit. The calculation step (step S104) calculates an amount of correction for a reference position, based on each of detection values that are detected at the detection step (step S103). The correction step (step S105) corrects a position of the substrate transfer unit (the fork 25) relative to the substrate processing unit 72 in the direction of travel and a position of the substrate transfer unit relative to the substrate processing unit in a direction that is perpendicular to the direction of travel, based on an amount of correction that is calculated at the calculation step (step S104). Thereby, it is possible to improve a degree of accuracy of centering at a time when a wafer W is placed on a substrate processing unit 72.

According to an embodiment, it is possible to improve a degree of accuracy of centering at a time when a substrate is placed in a substrate processing unit.

Although an embodiment(s) of the present disclosure has/have been explained above, the present disclosure is not limited to an embodiment(s) as described above and a variety of modifications are possible without departing from an essence thereof.

It should be considered that an embodiment(s) as disclosed herein is/are not limitative but is/are illustrative in all aspects thereof. In fact, it is possible to implement an embodiment(s) as described above in a variety of forms. Furthermore, an embodiment(s) as described above may be omitted, substituted, or modified in a variety of forms without departing from the appended claim(s) and an essence thereof.

What is claimed is:

1. A substrate processing apparatus, comprising:
    a substrate processing unit that holds and processes a substrate;
    a substrate transfer unit that has a rotational axis and carries the substrate in the substrate processing unit;
    a first sensor that detects a position of the substrate transfer unit relative to the substrate processing unit in a direction of travel thereof under a condition the substrate is carried in the substrate processing unit in the direction of travel;
    a second sensor that detects a position of the substrate transfer unit relative to the substrate processing unit in a direction that is perpendicular to the direction of travel; and
    a third sensor that detects an inclination of the rotational axis of the substrate transfer unit relative to the substrate processing unit.

2. The substrate processing apparatus according to claim 1, wherein
    the third sensor is arranged not to be along the second sensor in a direction that is perpendicular to the direction of travel.

3. The substrate processing apparatus according to claim 2, wherein:
    the first sensor and the second sensor are provided to be adjacent to a carry-in port of the substrate processing unit; and
    the third sensor is provided on an inner side or an outer side of the first sensor and the second sensor relative to the substrate processing unit.

4. The substrate processing apparatus according to claim 2, wherein:
    any of the first sensor, the second sensor, and the third sensor is an optical sensor that has a light-emitting unit and a light-receiving unit; and
    the light-emitting unit and the light-receiving unit are arranged to interpose at least one through-hole that is provided on the substrate transfer unit under a condition a position of the substrate transfer unit is detected.

5. The substrate processing apparatus according to claim 2, further comprising
    a controller configured to control the substrate processing unit, the substrate transfer unit, the first sensor, the second sensor and the third sensor, wherein:
    the controller is further configured to
        detect a position of the substrate transfer unit relative to the substrate processing unit in the direction of travel, a position of the substrate transfer unit relative to the substrate processing unit in a direction that is perpendicular to the direction of travel, and an inclination of the rotational axis of the substrate transfer unit relative to the substrate processing unit, by the first sensor, the second sensor, and the third sensor, under a condition the substrate is carried in the substrate processing unit by the substrate transfer unit;
    calculate an amount of correction for a reference position, based on each of detection values that are detected by the first sensor, the second sensor, and the third sensor; and
    correct a position of the substrate transfer unit relative to the substrate processing unit in the direction of travel and a position of the substrate transfer unit relative to the substrate processing unit in a direction that is perpendicular to the direction of travel, based on the calculated amount of correction.

6. The substrate processing apparatus according to claim 1, wherein:
    the first sensor and the second sensor are provided to be adjacent to a carry-in port of the substrate processing unit; and
    the third sensor is provided on an inner side or an outer side of the first sensor and the second sensor relative to the substrate processing unit.

7. The substrate processing apparatus according to claim 6, wherein:
    any of the first sensor, the second sensor, and the third sensor is an optical sensor that has a light-emitting unit and a light-receiving unit; and
    the light-emitting unit and the light-receiving unit are arranged to interpose at least one through-hole that is provided on the substrate transfer unit under a condition a position of the substrate transfer unit is detected.

8. The substrate processing apparatus according to claim 6, further comprising
a controller configured to control the substrate processing unit, the substrate transfer unit, the first sensor, the second sensor and the third sensor, wherein:
the controller is further configured to
detect a position of the substrate transfer unit relative to the substrate processing unit in the direction of travel, a position of the substrate transfer unit relative to the substrate processing unit in a direction that is perpendicular to the direction of travel, and an inclination of the rotational axis of the substrate transfer unit relative to the substrate processing unit, by the first sensor, the second sensor, and the third sensor, under a condition the substrate is carried in the substrate processing unit by the substrate transfer unit;
calculate an amount of correction for a reference position, based on each of detection values that are detected by the first sensor, the second sensor, and the third sensor; and
correct a position of the substrate transfer unit relative to the substrate processing unit in the direction of travel and a position of the substrate transfer unit relative to the substrate processing unit in a direction that is perpendicular to the direction of travel, based on the calculated amount of correction.

9. The substrate processing apparatus according to claim 1, wherein:
any of the first sensor, the second sensor, and the third sensor is an optical sensor that has a light-emitting unit and a light-receiving unit; and
the light-emitting unit and the light-receiving unit are arranged to interpose at least one through-hole that is provided on the substrate transfer unit under a condition a position of the substrate transfer unit is detected.

10. The substrate processing apparatus according to claim 9, wherein
the at least one through-hole includes a plurality of through-holes that are provided at positions that correspond to the first sensor, the second sensor, and the third sensor.

11. The substrate processing apparatus according to claim 10, further comprising
a controller configured to control the substrate processing unit, the substrate transfer unit, the first sensor, the second sensor and the third sensor, wherein:
the controller is further configured to
detect a position of the substrate transfer unit relative to the substrate processing unit in the direction of travel, a position of the substrate transfer unit relative to the substrate processing unit in a direction that is perpendicular to the direction of travel, and an inclination of the rotational axis of the substrate transfer unit relative to the substrate processing unit, by the first sensor, the second sensor, and the third sensor, under a condition the substrate is carried in the substrate processing unit by the substrate transfer unit;
calculate an amount of correction for a reference position, based on each of detection values that are detected by the first sensor, the second sensor, and the third sensor; and
correct a position of the substrate transfer unit relative to the substrate processing unit in the direction of travel and a position of the substrate transfer unit relative to the substrate processing unit in a direction that is perpendicular to the direction of travel, based on the calculated amount of correction.

12. The substrate processing apparatus according to claim 9, further comprising
a controller configured to control the substrate processing unit, the substrate transfer unit, the first sensor, the second sensor and the third sensor, wherein:
the controller is further configured to
detect a position of the substrate transfer unit relative to the substrate processing unit in the direction of travel, a position of the substrate transfer unit relative to the substrate processing unit in a direction that is perpendicular to the direction of travel, and an inclination of the rotational axis of the substrate transfer unit relative to the substrate processing unit, by the first sensor, the second sensor, and the third sensor, under a condition the substrate is carried in the substrate processing unit by the substrate transfer unit;
calculate an amount of correction for a reference position, based on each of detection values that are detected by the first sensor, the second sensor, and the third sensor; and
correct a position of the substrate transfer unit relative to the substrate processing unit in the direction of travel and a position of the substrate transfer unit relative to the substrate processing unit in a direction that is perpendicular to the direction of travel, based on the calculated amount of correction.

13. The substrate processing apparatus according to claim 1, further comprising
a controller configured to control the substrate processing unit, the substrate transfer unit, the first sensor, the second sensor and the third sensor, wherein:
the controller is further configured to
detect a position of the substrate transfer unit relative to the substrate processing unit in the direction of travel, a position of the substrate transfer unit relative to the substrate processing unit in a direction that is perpendicular to the direction of travel, and an inclination of the rotational axis of the substrate transfer unit relative to the substrate processing unit, by the first sensor, the second sensor, and the third sensor, under a condition the substrate is carried in the substrate processing unit by the substrate transfer unit;
calculate an amount of correction for a reference position, based on each of detection values that are detected by the first sensor, the second sensor, and the third sensor; and
correct a position of the substrate transfer unit relative to the substrate processing unit in the direction of travel and a position of the substrate transfer unit relative to the substrate processing unit in a direction that is perpendicular to the direction of travel, based on the calculated amount of correction.

14. A substrate processing method, comprising:
detecting, by using a substrate transfer unit that has a rotational axis, under a condition a substrate is carried in a substrate processing unit in a direction of travel thereof, a position of the substrate transfer unit relative to the substrate processing unit in the direction of travel, a position of the substrate transfer unit relative to the substrate processing unit in a direction that is perpendicular to the direction of travel, and an inclination of the rotational axis of the substrate transfer unit relative to the substrate processing unit;

calculating an amount of correction for a reference position, based on each of the detected detection values; and correcting a position of the substrate transfer unit relative to the substrate processing unit in the direction of travel and a position of the substrate transfer unit relative to the substrate processing unit in a direction that is perpendicular to the direction of travel, based on the calculated amount of correction.

* * * * *